(12) United States Patent
Kobayashi

(10) Patent No.: US 7,749,684 B2
(45) Date of Patent: *Jul. 6, 2010

(54) METHOD FOR MANUFACTURING CONDUCTIVE PATTERN FORMING BODY

(75) Inventor: Hironori Kobayashi, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 646 days.

This patent is subject to a terminal disclaimer.

(21) Appl. No.: 10/649,212

(22) Filed: Aug. 27, 2003

(65) Prior Publication Data

US 2005/0112810 A1    May 26, 2005

(30) Foreign Application Priority Data

Aug. 28, 2002   (JP) ............................. 2002-249604
Aug. 28, 2002   (JP) ............................. 2002-249608

(51) Int. Cl.
    *G03F 7/26*   (2006.01)
(52) U.S. Cl. ..................................... 430/311
(58) Field of Classification Search ................ 430/315, 430/311, 322
    See application file for complete search history.

(56) References Cited

U.S. PATENT DOCUMENTS

| 6,846,616 B2 | 1/2005 | Kobayashi et al. | |
| 2001/0024842 A1 | 9/2001 | Morii | |
| 2002/0006558 A1* | 1/2002 | Kobayashi et al. | ............. 430/7 |
| 2003/0232286 A1* | 12/2003 | Watanabe et al. | ........... 430/315 |
| 2004/0043334 A1* | 3/2004 | Kobayashi et al. | .......... 430/315 |

FOREIGN PATENT DOCUMENTS

| JP | 08-186351 A | | 7/1996 |
| JP | 10-268582 A | | 10/1998 |
| JP | 2000-249821 | * | 9/2000 |
| JP | 2001-104798 | | 4/2001 |
| JP | 2001-234356 | | 8/2001 |
| JP | 2001-242316 | | 9/2001 |
| JP | 2001-242317 | | 9/2001 |
| JP | 2001-272774 | | 10/2001 |
| JP | 2004-151330 | * | 5/2004 |

* cited by examiner

*Primary Examiner*—Kathleen Duda
*Assistant Examiner*—Brittany Raymond
(74) *Attorney, Agent, or Firm*—Ladas & Parry LLP

(57) ABSTRACT

A method for manufacturing a conductive pattern capable of forming a highly precise pattern, also capable of forming by using a simple process, and being free from problems such as treatment of waste fluids. The method for manufacturing a conductive pattern forming body includes a process of preparing a pattern forming body substrate including a base material, and a photocatalyst containing layer formed on the base material including a photocatalyst and a binder whose wettability of an energy irradiated part is changed so as a contact angle to a liquid is reduced; a process of forming wettability pattern including a liquid repellent area and a lyophilic area on the photocatalyst containing layer by irradiating the photocatalyst containing layer in a pattern with energy; a metal colloid coating process of adhering a metal colloid only to the lyophilic area of the surface of the photocatalyst containing layer on which the wettability pattern is formed, by coating the metal colloid; and a process of forming a conductive pattern by solidifying the metal colloid adhered to the lyophilic area of the wettability pattern.

22 Claims, 8 Drawing Sheets

METHOD FOR MANUFACTURING CONDUCTIVE PATTERN FORMING BODY

BACKGROUND OF THE INVENTION

1. Field of the Invention

The present invention relates to a method for manufacturing a conductive pattern forming body which may be used in coatings such as various highly precise electric circuits such as a printed-circuit board.

2. Description of the Related Art

Conventionally, when highly precise conductive pattern forming body such as a printed-circuit board is manufactured, a photoresist such as a dry film is laminated on a copper-clad laminate which is formed by plating the entire surface of a substrate with copper, followed by pattern-exposure using a photomask or the like and developing, thereby forming the conductive pattern forming body.

However, in such a method using photolithography method, it is necessary to pass through various processes such as plating of a substrate with a metal, formation of a photoresist layer, exposure and developing, making the method for manufacturing complicated and a cost may be a problem. Also, a large amount of waste liquid occurring from developing is harmful, and there is an environmental problem that treatments are necessary to drain these waste liquids outside.

Also, there is a method for manufacturing a printed-circuit board by a method using screen printing. However, this method has a problem on precision so that it cannot be applied to the case of manufacturing a highly precise conductive pattern.

SUMMARY OF THE INVENTION

The present invention has been conducted in view of the above problems and it is a main object to provide a method for manufacturing a conductive pattern, which is capable of forming a highly precise pattern by a simple process and being free from such a problem concerning treatment of waste fluids.

In order to achieve the above object, the present invention provides a method for manufacturing a conductive pattern forming body comprising: a process of preparing a pattern forming body substrate comprising a base material, and a photocatalyst containing layer formed on the base material comprising a photocatalyst and a binder whose wettability of an energy irradiated part is changed so as a contact angle to a liquid is reduced; a process of forming a wettability pattern comprising a liquid repellent area and a lyophilic area on the photocatalyst containing layer by irradiating the photocatalyst containing layer in a pattern with energy; a metal colloid coating process of adhering a metal colloid only to the lyophilic area of the surface of the photocatalyst containing layer on which the wettability pattern is formed, by coating the metal colloid; and a process of forming a conductive pattern by solidifying the metal colloid adhered to the lyophilic area of the wettability pattern.

According to the present invention, the metal colloid can be formed in a pattern on the photocatalyst containing layer with ease by carrying out treatment of adhering the metal colloid to the entire surface by using, for example, a dip coating method, and can be made into a highly precise conductive pattern by solidifying it. As a consequence, since a highly precise conductive pattern can be formed in a simple process with high accuracy, a highly precise conductive pattern can be formed at a low cost.

In the above invention, the photocatalyst containing layer may contain a decomposable material which is decomposed by an action of the photocatalyst by energy irradiation whereby the wettability of the photocatalyst containing layer can be changed. In the present invention, although the change in the wettability of the photocatalyst containing layer by the action of the photocatalyst may be caused by a material of the binder, but the wettability of the surface may be changed in a pattern by containing the decomposable material, which is decomposed by an action of the photocatalyst, in this manner in the photocatalyst containing layer.

Also, in the above invention, the binder is preferably a layer containing an organopolysiloxane. This reason is as follows. In the present invention, the properties required for the photocatalyst containing layer are that it has liquid repellency when it is not irradiated with energy, and it is made to be lyophilic by an action of the photocatalyst in the photocatalyst containing layer, which is in contact, when it is irradiated with energy. For a material imparting such properties to the photocatalyst containing layer, it is preferable to use the organopolysiloxane.

In this case, the organopolysiloxane is preferably a polysiloxane containing a fluoroalkyl group. This reason is that such a polysiloxane containing a fluoroalkyl group can increase a difference in wettability between an energy irradiated part and a non-irradiated part.

In the above invention, after the conductive pattern forming process, the method may further comprises a non-drawn part removing process of removing a non-conductive pattern part on which a conductive pattern part is not formed. This is because, in a case where the photocatalyst containing layer is formed of a conductive material, it is difficult to form a conductive pattern forming body even if the photocatalyst containing layer is provided with a conductive pattern, a conductive pattern forming body can be made by removing a non-conductive pattern part on which this conductive pattern part is not formed to bare the insulating base material.

In the above invention, the metal colloid is preferably a silver colloid or a gold colloid using water as a medium.

Also, the coating of the metal colloid in the metal colloid coating process may be a dip coating method or a spin coating method.

And further, the coating of the metal colloid in the metal colloid coating process may be a nozzle discharging method. Among the above, the nozzle discharging method is preferably an ink jet method.

In the above invention, the photocatalyst is preferably titanium dioxide ($TiO_2$). Since titanium dioxide has high bandgap energy, it is effective as a photocatalyst, and also, it is chemically stable without any toxicity, and is easily available.

The present invention provides a method for manufacturing a conductive pattern forming body comprising: a process of preparing a pattern forming body substrate comprising a base material, a photocatalyst treatment layer formed on the base material containing at least a photocatalyst, and a wettability variable layer formed on the photocatalyst treatment layer which is a layer whose wettability of an energy irradiated part is changed so as a contact angle to a liquid is reduced; a process of forming a wettability pattern comprising a liquid repellent area and a lyophilic area on the wettability variable layer by irradiating the wettability variable layer in a pattern with energy; a metal colloid coating process of adhering a metal colloid only to the lyophilic area of the surface of the wettability variable layer on which the wettability pattern is formed, by coating the metal colloid; and a process of forming a conductive pattern by solidifying the metal colloid adhered to the lyophilic area of the wettability pattern.

According to the present invention, since the wettability variable layer is provided, the metal colloid can be adhered only to the lyophilic area, and it is therefore possible to form a highly precise conductive pattern. Also, since the conductive pattern is formed on the wettability variable layer, the photocatalyst treatment layer and the conductive pattern are not in direct contact with each other, and therefore, the possibility of the conductive pattern being affected with time by the photocatalyst is reduced, which makes it possible to produce a high quality conductive pattern forming body.

In the above invention, it is preferable that the wettability variable layer is a layer containing an organopolysiloxane. In the present invention, the properties required for the wettability variable layer are that it has liquid repellency when it is not irradiated with energy, and it becomes lyophilic when it is irradiated with energy. Therefore, it is preferable to use the organopolysiloxane as a material imparting such properties to the wettability variable layer.

In this case, the organopolysiloxane is preferably a polysiloxane containing a fluoroalkyl group. This is because such a polysiloxane containing a fluoroalkyl group can increase a difference in wettability between an energy irradiated part and a non-irradiated part.

In the above invention, after the conductive pattern forming process, the method may further comprises a non-drawn part removing process of removing a non-conductive pattern part on which a conductive pattern part is not formed. This is because, in a case where the wettability variable layer is formed of a conductive material, it is difficult to form a conductive pattern forming body even if the wettability variable layer is provided with a conductive pattern, a conductive pattern forming body can be made by removing a non-conductive pattern part on which this conductive pattern part is not formed to bare the insulating base material.

Moreover in the above invention, the metal colloid is preferably a silver colloid or a gold colloid using water as a medium.

In this case, the coating of the metal colloid in the metal colloid coating process may be a dip coating method or a spin coating method.

Also, the coating of the metal colloid in the metal colloid coating process may be a nozzle discharging method. Among the above, the nozzle discharging method is preferably an ink jet method.

In the above invention, the photocatalyst is preferably titanium dioxide ($TiO_2$). Since titanium dioxide has high bandgap energy, it is effective as a photocatalyst, and also, it is chemically stable without any toxicity, and is easily available.

The present invention provides a method for manufacturing a conductive pattern forming body comprising: a process of preparing a pattern forming body substrate comprising a base material, a photocatalyst treatment layer formed on the base material containing at least a photocatalyst, and a decomposition removal layer formed on the photocatalyst treatment layer which is decomposed and removed by an action of the photocatalyst by energy irradiation; a process of forming a decomposition removal pattern on the decomposition removal layer by irradiating the decomposition removal layer in a pattern with energy; a metal colloid coating process of adhering a metal colloid in a pattern to the surface of the decomposition removal layer on which the decomposition removal pattern is formed, by coating the metal colloid; and a process of forming a conductive pattern by solidifying the metal colloid adhered in a pattern.

According to the present invention, since the decomposition removal layer is provided, an energy irradiated part of the decomposition removal layer is decomposed and removed by an action of the photocatalyst by energy irradiation, the irregularities can be formed on the surface. Utilizing these irregularities, the metal colloid can be coated with ease by, for example, an ink jet method, and therefore, a highly precise conductive pattern forming body can be produced.

In the above invention, it is preferable that a contact angle of a liquid to the decomposition removal layer is different from a contact angle of a liquid to the photocatalyst treatment layer bared by the decomposition of the decomposition removal layer. By this, on the decomposition removal layer, a part with the decomposition removal layer remaining, that is not irradiated with energy, can be a liquid repellent area, and a part with bared base material, that is irradiated with energy, can be a lyophilic area. Not only the above irregularities but also a difference in wettability can be utilized, making it possible to produce a highly precise conductive pattern forming body.

Also, in the above invention, it is preferable that the decomposition removal layer is any one of a self-assembled monolayer, a Langmuir Blodgett film and a layer-by-layer self-assembled film. This is because when the decomposition removal layer is the above film, it is possible to form a relatively high strength film with no defects.

In the above invention, after the conductive pattern forming process, the method may further comprises a non-drawn part removing process of removing a non-conductive pattern part on which a conductive pattern part is not formed. This is because, in a case where the decomposition removal layer is formed of a conductive material, it is difficult to form a conductive pattern forming body even if the decomposition removal layer is provided with a conductive pattern, a conductive pattern forming body can be made by removing a non-conductive pattern part on which this conductive pattern part is not formed to bare the insulating base material.

Moreover in the above invention, the metal colloid is preferably a silver colloid or a gold colloid using water as a medium.

In this case, the coating of the metal colloid in the metal colloid coating process may be a dip coating method or a spin coating method.

Also, the coating of the metal colloid in the metal colloid coating process may be a nozzle discharging method. Among the above, the nozzle discharging method is preferably an ink jet method.

In the above invention, the photocatalyst is preferably titanium dioxide ($TiO_2$). Since titanium dioxide has high bandgap energy, it is effective as a photocatalyst, and also, it is chemically stable without any toxicity, and is easily available.

Also, the present invention provides a method for manufacturing a conductive pattern forming body comprising: a property variable pattern forming process of placing a photocatalyst treatment layer side substrate comprising a base member and a photocatalyst treatment layer containing a photocatalyst, and a pattern forming body substrate comprising a property variable layer whose property is changed by an action of a photocatalyst in the photocatalyst treatment layer so that the photocatalyst treatment layer and the property variable layer are placed with a gap of 200 μm or less, and then, irradiating with energy from predetermined direction to form a property variable pattern, whose property is changed, on a surface of the property variable layer; a metal colloid coating process of adhering a metal colloid in a pattern to the surface of the pattern forming body substrate on which the property variable pattern is formed by coating the metal colloid; and a process of forming a conductive pattern by solidifying the metal colloid adhered in a pattern to the property variable pattern.

According to the present invention, by placing the photocatalyst treatment layer and the property variable layer with a predetermined clearance and irradiating with energy, the properties of the energy irradiated part of the property variable layer can be varied efficiently, thereby a pattern can be formed. It is therefore possible to produce a conductive pattern forming body having a highly precise property varied pattern without any particular after treatment after energy irradiation. Also, this results in the formation of a highly precise conductive pattern when the property variable layer is made of, for example, an insulated material.

In the above invention, it is preferable that the photocatalyst treatment layer side substrate comprises the base member and the photocatalyst treatment layer formed on the base member in a pattern. This is because patterns differing in properties can be formed on the property variable layer without using a photomask by forming the photocatalyst treatment layer in a pattern in the above manner. Also, since the properties of only the surface which is in contact with or facing to the photocatalyst treatment layer is varied, the irradiated energy is not limited to the parallel energy, and also, the energy irradiating direction is not particularly limited. Therefore, there are merits that the freedom of type and arrangement of an energy source are greatly increased.

Also, in the above invention, it is preferable that the photocatalyst treatment layer side substrate prepared in the photocatalyst treatment layer side substrate preparing process comprises the base member, the photocatalyst treatment layer formed on the base member, and a photocatalyst treatment layer side light shielding part formed in a pattern; and the energy irradiation in the property variable pattern forming process is carried out from the photocatalyst treatment layer side substrate.

This reason is that since the photocatalyst treatment layer side substrate is provided with the photocatalyst treatment layer side light shielding part, it is not necessary to use a photomask when energy is irradiated, and therefore, alignment with a photomask is not needed, which makes it possible to simplify the process.

In this case, in the photocatalyst treatment layer side substrate, the photocatalyst treatment layer side light shielding part may be formed in a pattern on the base member, and the photocatalyst treatment layer may further be formed thereon. Moreover, in the photocatalyst treatment layer side substrate, the photocatalyst treatment layer is formed on the base member, and the photocatalyst treatment layer side light shielding part may be formed in a pattern on the photocatalyst treatment layer.

It may be said that the photocatalyst treatment layer side light shielding part is preferably placed in contact with or close to the property variable layer, in terms of the precision of a resulting property variable pattern. It is therefore preferable to place the photocatalyst treatment layer side light shielding part at the aforementioned position. Also, in a case of forming the photocatalyst treatment layer side light shielding part on the photocatalyst treatment layer, there is an advantage that it may be used as a spacer when the photocatalyst treatment layer and the property variable layer are contacted or faced in the above property variable pattern forming process.

In the above invention, it is preferable that the photocatalyst treatment layer is a layer formed by forming a photocatalyst as a film on the base member by a vacuum film forming method. By accordingly forming the photocatalyst treatment layer by a vacuum film forming method, the photocatalyst treatment layer with few irregularities on the surface, with even film thickness, and uniform quality can be formed so that the property variable pattern on the surface of the property variable layer can be formed evenly and high efficiently.

Also, the photocatalyst treatment layer may be a layer comprising a photocatalyst and a binder. By accordingly using a binder, the photocatalyst treatment layer can be formed relatively easily, with the result that the pattern forming body can be manufactured at a low cost.

In the above invention, the photocatalyst is preferably titanium dioxide ($TiO_2$). Since titanium dioxide has high bandgap energy, it is effective as a photocatalyst, and also, it is chemically stable without any toxicity, and is easily available.

Also, it is preferable that, in the pattern forming body substrate preparing process, the pattern forming body substrate is prepared by forming the property variable layer on a base material. This is because, when the property variable layer has low strength and has no self-supporting ability, the property variable layer is preferably formed on the base material.

In the above invention, it is preferable that the property variable layer is a wettability variable layer whose wettability is changed so as a contact angle to a liquid is reduced by an action of the photocatalyst in the photocatalyst containing layer when energy is irradiated. When the property variable layer is a wettability variable layer, an energy irradiated area can be made to be a lyophilic area, and a non-energy irradiated area can be made to be a liquid repellent area. Therefore, it is possible to adhere the metal colloid only to the lyophilic area by utilizing the difference in wettability and the conductive pattern can be formed with ease.

In this case, it is preferable that the wettability variable layer is a layer containing an organopolysiloxane. In the present invention, the properties required for the wettability variable layer are that it has liquid repellency by an action of the photocatalyst in the contacting or facing photocatalyst treatment layer, when it is not irradiated with energy, and it becomes lyophilic when it is irradiated with energy. Therefore, it is preferable to use the organopolysiloxane as a material imparting such properties to the wettability variable layer.

In this case, the organopolysiloxane is preferably an organopolysiloxane containing a fluoroalkyl group. By containing a fluoroalkyl group, a difference in wettability between an energy irradiated part and a non-irradiated part can be increased.

In the above invention, the pattern forming body substrate may comprise the wettability variable layer having a self-supporting ability. This is because when the wettability variable layer has self-supporting ability, it is not necessary to use a base material or the like and the pattern forming body can be manufactured at a low cost if, for example, a commercially available resin plate is used.

Also, in the above invention, it is preferable that the property variable layer is a decomposition removal layer which is decomposed and removed by an action of the photocatalyst in the photocatalyst treatment layer when energy is irradiated. The reason is that when the property variable layer is a decomposition removal layer, irregularities can be formed on the surface by the above energy irradiation, and therefore, the metal colloid can be adhered easily by, for example, an ink jet method.

In this case, it is preferable that a contact angle of a liquid to the decomposition removal layer is different from a contact angle of a liquid to the base material bared by the decomposition and removal of the decomposition removal layer. By this, the bared base material, that is irradiated with energy, can be a lyophilic area, and a part with the decomposition removal layer remaining, that is not irradiated with energy, can be a liquid repellent area. Therefore, the metal colloid can be adhered easily.

In the above invention, it is preferable that the decomposition removal layer is any one of a self-assembled monolayer, a Langmuir Blodgett film, and a layer-by-layer self-assembled film. This is because when the decomposition removal layer is the above film, a relatively high strength film with no defects can be formed easily.

In the invention, it is preferable that a clearance between the photocatalyst treatment layer and the surface of the property variable layer is in a range of 0.2 µm to 10 µm, when energy is irradiated to the surface of the property variable layer. By irradiating energy with a clearance of the above range, when irradiating the above mentioned energy, the properties of the surface of the property variable layer can be changed more efficiently.

Also, in the above invention, it is preferable that the property variable layer is a layer containing no photocatalyst. As mentioned above, in the present invention, since the property variable layer is a layer containing no photocatalyst, a problem that the property variable layer is affected with time can be avoided.

Further in the above invention, it is preferable that the metal colloid is a silver colloid or a gold colloid using water as a medium.

In this case, the coating of the metal colloid in the metal colloid coating process may be a dip coating method or a spin coating method.

Also, the coating of the metal colloid in the metal colloid coating process may be a nozzle discharging method. Among the above, an ink jet method is preferable.

Also, the present invention provides a conductive pattern forming body comprising: a base material; a photocatalyst containing layer which is a layer formed on the base material whose wettability of an energy irradiated part is changed so as a contact angle to a liquid is reduced, and contains at least a photocatalyst and a binder; and a metal composition formed on the photocatalyst containing layer by solidifying a metal colloid in a pattern. According to the present invention, by providing the photocatalyst containing layer, the metal colloid can be coated only to a lyophilic area with ease, and also a highly precise conductive pattern forming body can be formed.

In this case, the photocatalyst containing layer may contain a decomposable material which is decomposed by an action of the photocatalyst by energy irradiation and a wettability of the photocatalyst containing layer can be changed by this. In the present invention, although the change in the wettability of the photocatalyst containing layer by the action of the photocatalyst may be caused by a material of the binder, but the wettability of the surface may be changed in a pattern by containing the decomposable material in the photocatalyst containing layer.

Also, the present invention provides a conductive pattern forming body comprising: a base material; a photocatalyst containing layer which is a layer formed on the base material in a pattern whose wettability of an energy irradiated part is changed so as a contact angle to a liquid is reduced, and contains at least a photocatalyst and a binder; and a metal composition formed on the photocatalyst containing layer by solidifying a metal colloid. According to the present invention, by providing the photocatalyst containing layer, a conductive pattern can be formed easily by utilizing a difference in wettability, and also, the conductive pattern forming body can be formed at a low cost. Also, since the photocatalyst containing layer is formed in a pattern and the insulating base material is bared in a part other than the conductive pattern, it is possible to form a conductive pattern forming body even if the photocatalyst containing layer is electrically conductive.

In this case, the photocatalyst containing layer may contain a decomposable material which is decomposed by an action of the photocatalyst by energy irradiation and a wettability of the photocatalyst containing layer can be changed by this. In the present invention, although the change in the wettability of the photocatalyst containing layer by the action of the photocatalyst may be caused by a material of the binder, but the wettability of the surface may be changed in a pattern by containing the decomposable material, which is decomposed by an action of the photocatalyst, in the photocatalyst containing layer.

Also, the present invention provides a conductive pattern forming body comprising: a base material; a photocatalyst treatment layer contains at least a photocatalyst, on the base material; a wettability variable layer whose wettability of an energy irradiated part is changed so as a contact angle to a liquid is reduced, on the photocataylst treatment layer; and a metal composition formed on the wettability variable layer by solidifying a metal colloid in a pattern. According to the present invention, by providing the wettability variable layer, the metal colloid can be adhered easily in a pattern in high precision by utilizing a difference in wettability. Also, since the photocatalyst treatment layer and the conductive pattern are not directly contacted, the possibility of the conductive pattern being affected with time by the photocatalyst is low, which makes it possible to produce a high quality conductive pattern forming body.

Also, the present invention provides a conductive pattern forming body comprising: a base material; a photocatalyst treatment layer contains at least a photocatalyst, on the base material; a wettability variable layer whose wettability of an energy irradiated part is changed so as a contact angle to a liquid is reduced, formed in a pattern on the photocataylst treatment layer; and a metal composition formed on the wettability variable layer by solidifying a metal colloid.

According to the present invention, by providing the wettability variable layer, the metal colloid can be adhered easily in a pattern in high precision by utilizing a difference in wettability. Also, since the photocatalyst treatment layer and the conductive pattern are not directly contacted, the possibility of the conductive pattern being affected with time by the photocatalyst is low, which makes it possible to produce a high quality conductive pattern forming body. Further, since the wettability variable layer is formed in a pattern and the relatively insulating photocatalyst treatment layer is bared in a part other than the conductive pattern, it is possible to form a conductive pattern forming body even if the wettability variable layer is electrically conductive.

Also, the present invention provides a conductive pattern forming body comprising: a base material; a photocatalyst treatment layer contains at least a photocatalyst, formed in a pattern on the base material; a wettability variable layer whose wettability of an energy irradiated part is changed so as a contact angle to a liquid is reduced, formed on the photocataylst treatment layer; and a metal composition formed on the wettability variable layer by solidifying a metal colloid.

According to the present invention, by providing the wettability variable layer, the metal colloid can be adhered easily in a pattern in high precision by utilizing a difference in wettability. Also, since the photocatalyst containing layer is formed in a pattern, and the wettability variable layer and the conductive pattern are formed thereon, the relatively insulating base material is bared in a part other than the conductive pattern so that a conductive pattern forming body can be formed even if the wettability variable layer and the photocatalyst treatment layer are electrically conductive.

Also, the present invention provides a conductive pattern forming body comprising: a base material; a photocatalyst treatment layer contains at least a photocatalyst, on the base material; a decomposition removal layer which is a layer decomposed and removed by an action of the photocatalyst when energy is irradiated, on the photocataylst treatment layer; and a metal composition formed on the photocatalyst treatment layer which is the decomposition removal layer is decomposed and removed, by solidifying a metal colloid in a pattern.

According to the present invention, by providing the decomposition removal layer, irregularities can be formed on the surface by an action of the photocatalyst by the above energy irradiation. The metal colloid can be easily adhered by, for example, an ink jet method and it is therefore possible to make an easily producible conductive pattern forming body.

Moreover in the above invention, it is preferable that the decomposition removal layer is any one of a self-assembled monolayer, a Langmuir Blodgett film, and a layer-by-layer self-assembled film. This is because when the decomposition removal layer is the above film, it is possible to form a relatively high strength film with no defects.

Also, the present invention provides a conductive pattern forming body comprising: a wettability variable layer whose wettability is changed by an action of a photocatalyst; and a metal composition formed on the wettability variable layer by solidifying a metal colloid in a pattern. According to the present invention, since the wettability variable layer is provided, the metal composition can be formed easily. Moreover, when the wettability variable layer has insulating property, it is possible to form an excellent conductive pattern forming body.

In this case, the wettability variable layer may be formed on a base material. This is because the property variable layer is preferably formed on the base material when the wettability variable layer has low strength and no self-supporting ability.

In the above invention, it is preferable that the wettability variable layer is a layer containing an organopolysiloxane. Among the above, the organopolysiloxane is preferably a polysiloxane containing a fluoroalkyl group. This reason is that such wettability variable layer can obtain a large change in wettability by energy irradiation.

Also, the present invention provides a conductive pattern forming body comprising: a base material; a decomposition removal layer on the base material which is decomposed and removed by an action of a photocatalyst; and a metal composition formed on the base material which is bared by the decomposition and removal of the decomposition removal layer, by solidifying a metal colloid in a pattern.

According to the present invention, since the decomposition removal layer is provided, a pattern having irregularities can be formed on the base material. And by utilizing the irregularities, a conductive pattern can be formed easily. Also, when the decomposition removal layer has insulating property, it is possible to form an excellent conductive pattern forming body.

In the above invention, it is preferable that a contact angle of the decomposition removal layer to a liquid is different from a contact angle of the base material, which is bared by the decomposition of the decomposition removal layer, to a liquid. By this, besides the surface irregularities, a part with bared base material, that is irradiated with energy, can be a lyophilic area and a part with the decomposition removal layer remaining, that is not irradiated with energy, can be a liquid repellent area. Therefore, the conductive pattern can be formed easily.

Also, in this case, it is preferable that it is any one of a self-assembled monolayer, a Langmuir Blodgett film and a layer-by-layer self-assembled film. This is because when the decomposition removal layer is the above film, it is possible to easily form a relatively high strength film with no defects.

Also, the present invention provides a conductive pattern forming body comprising: a base material; a wettability variable layer formed in a pattern on the base material whose wettability is changed by an action of a photocatalyst; and a metal composition formed on the wettability variable layer, by solidifying a metal colloid. By providing the wettability variable layer on the base material, a conductive pattern forming body can be easily produced. Further, when the base material has insulating property, it is possible to form an excellent conductive pattern forming body.

DESCRIPTION OF THE PREFERRED EMBODIMENT

The present invention relates to a method for manufacturing a conductive pattern forming body and to a conductive pattern forming body. Each will be explained hereinbelow.

A. Method for Manufacturing a Conductive Pattern Forming Body

First, the method for manufacturing a conductive pattern forming body according to the present invention will be explained. In the method for manufacturing a conductive pattern forming body according to the present invention, there are four embodiments. Each embodiment will be hereinafter explained separately.

1. First Embodiment

First, the first embodiment of the method for manufacturing a conductive pattern forming body according to the present invention will be explained. The first embodiment of the method for manufacturing a conductive pattern forming body according to the present invention comprises:

a process of preparing a pattern forming body substrate comprising a base material, and a photocatalyst containing layer formed on the base material comprising a photocatalyst and a binder whose wettability of an energy irradiated part is changed so as a contact angle to a liquid is reduced;

a process of forming a wettability pattern comprising a liquid repellent area and a lyophilic area on the photocatalyst containing layer by irradiating the photocatalyst containing layer in a pattern with energy;

a metal colloid coating process of adhering a metal colloid only to the lyophilic area of the surface of the photocatalyst containing layer on which the wettability pattern is formed, by coating the metal colloid; and a process of forming a conductive pattern by solidifying the metal colloid adhered to the lyophilic area of the wettability pattern.

In the method for manufacturing a conductive pattern forming body in this embodiment as aforementioned, the photocatalyst containing layer is irradiated in a pattern with energy, whereby the wettability of the surface is changed by an action of the photocatalyst contained in the photocatalyst containing layer. A pattern of the part changed in wettability, that is, a lyophilic area is formed on the surface of the photocatalyst containing layer. Therefore, because after treatments such as developing and cleaning after irradiating energy in the formation of the pattern are not necessary, patterns differing in wettability can be formed by fewer processes and at a lower cost than in conventional cases. Further, by coating the metal colloid to the wettability pattern on the photocatalyst containing layer, the metal colloid can be adhered only to the pattern of the lyophilic area, and by solidifying this, a conductive pattern can be easily formed.

Such method for manufacturing a conductive pattern forming body in this embodiment will be explained in detail with reference to the drawings. FIG. 1a to 1d show one example of a method for manufacturing a conductive pattern forming body in this embodiment.

Figure 1A:
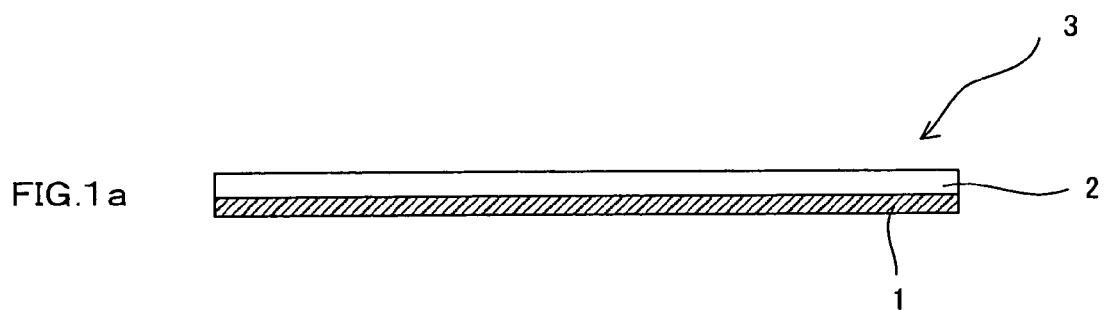
FIGS. 1a to 1d are process diagrams showing one example of a method for manufacturing a conductive pattern forming body according to the present invention.

In this example, first a pattern forming body substrate 3, comprising a photocatalyst containing layer 2 formed on a base material 1, is prepared (see FIG. 1a, pattern forming body substrate preparing process).

Figure 1B:
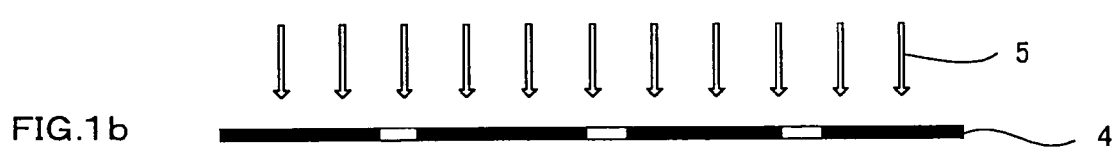
Figure 1C:
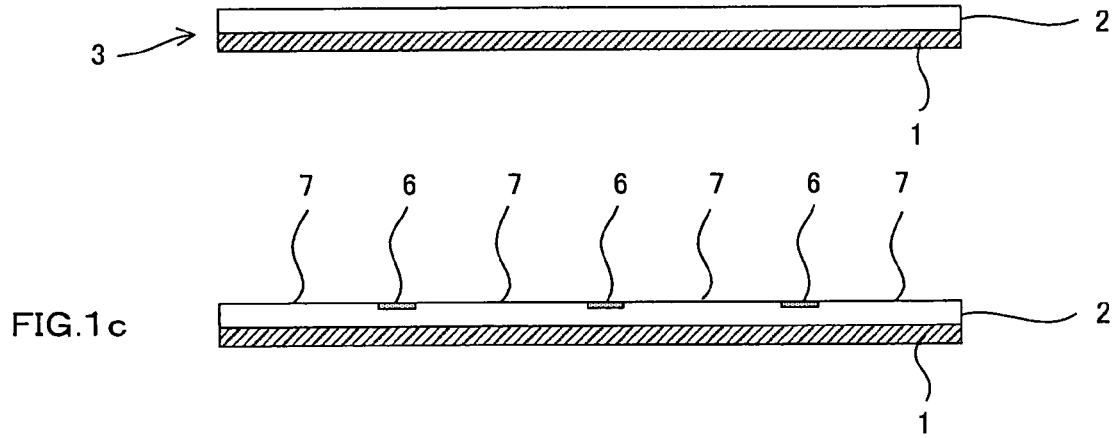
Figure 1D:
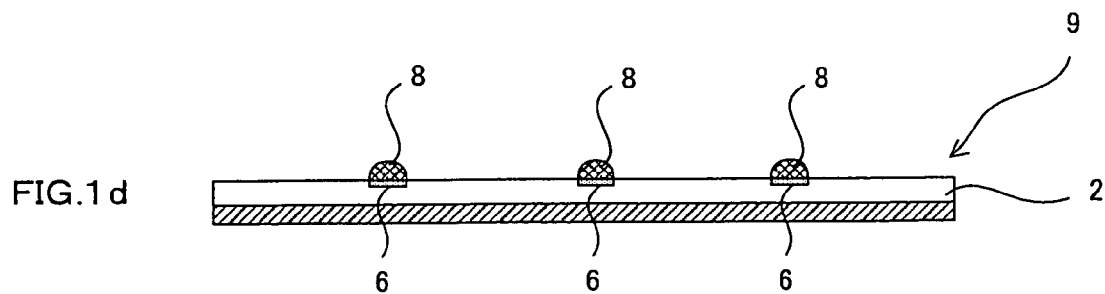

Next, as shown in FIG. 1b, a photomask 4 on which a necessary pattern is drawn is placed on the photocatalyst containing layer 2 side of the pattern forming body substrate 3, and a ultraviolet light 5 is irradiated via this photomask 4. By this process, as shown in FIG. 1c, a wettability pattern comprising a lyophilic area 6 and a liquid repellent area 7 is formed on the surface of the photocatalyst containing layer 2 (wettability pattern forming process).

Then, a metal colloid is adhered only to the lyophilic area 6 by coating the metal colloid to the entire surface of the above pattern forming body substrate 3 (metal colloid coating process). Thereafter, by curing the metal colloid, a conductive pattern forming body 9 provided with the conductive pattern 8 formed on the photocatalyst containing layer 2 can be obtained.

As regards such method for manufacturing a conductive pattern forming body, each process will be explained in detail.

(1) Pattern Forming Body Substrate Preparing Process

The pattern forming body substrate preparing process in this embodiment is a process of preparing a pattern forming body substrate comprising a photocatalyst containing layer containing a photocatalyst and a binder is formed on a base material.

The pattern forming body substrate manufactured in this process comprises at least a photocatalyst containing layer and a base material as mentioned above, and is usually manufactured by forming a thin film-like photocatalyst containing layer on a base material by a predetermined method.

(Photocatalyst Containing Layer)

The photocatalyst containing layer used in this embodiment comprises a photocatalyst and a binder, and is a photocatalyst containing layer whose wettability of an energy irradiated part is changed so as a contact angle to a liquid is reduced.

As mentioned above, the wettability of the photocatalyst containing layer is made to be changed so as a contact angle to a liquid is reduced by energy irradiation and pattern irradiation with energy is carried out as will be described later, whereby the wettability can be easily changed in a pattern and it is possible to form a pattern of a lyophilic area having a small contact angle to a liquid. As a consequence, a conductive pattern forming body can be manufactured efficiently and a conductive pattern forming body can be obtained at a low cost.

Here, the lyophilic area means an area having a small contact angle to a liquid and having high wettability to a metal colloid which will be described later. On the other hand, the liquid repellent area means an area having a large contact angle to a liquid and having low wettability to the metal colloid.

The contact angle of the photocatalyst containing layer to the metal colloid is preferably 50° or more, more preferably 60° or more, and particularly preferably 70° or more, in a part where energy is not irradiated, namely the liquid repellent area. This reason is that since the part where energy is not irradiated is a part of which liquid repellency is required in this embodiment, the liquid repellency is not sufficient when the contact angle to a liquid is small. And when the metal colloid is coated on the entire surface in the below mentioned metal colloid coating process, it is not preferable because the metal colloid may be left on the area where the conductive pattern is not formed.

Also, the contact angle of the photocatalyst containing layer to the metal colloid is preferably 40° or less, more preferably 30° or less, and particularly preferably 20° or less, in a part where energy is irradiated, namely the lyophilic area. This reason is that in a case where the contact angle to the metal colloid is high in a part where energy is irradiated, namely the lyophilic area, there is the possibility of the metal colloid being repelled even in the lyophilic area when coating the metal colloid on the entire surface and the patterning the lyophilic area with the metal colloid may be difficult.

The contact angle to a liquid meant here was obtained in the following manner: the contact angles of the subject material to liquids having different surface tensions were measured (measured 30 seconds after liquid droplets are dripped from a micro-syringe) by a contact angle measuring device (CA-Z model, manufactured by Kyowa Interface Science Co., LTD.) to obtain the contact angle from the results of measurement or a graph based on these results. In this measurement, wetting index standard solutions manufactured by JUNSEI CHEMICAL CO., LTD. were used as the liquids having different surface tensions.

In a case of using the photocatalyst containing layer as aforementioned in this embodiment, the photocatalyst containing layer may be formed such that fluorine is contained in the photocatalyst containing layer, and the fluorine content on the surface of the photocatalyst containing layer is reduced by an action of the photocatalyst when energy is irradiated to the photocatalyst containing layer as compared to that before energy irradiation. Also, the photocatalyst containing layer may be formed such that it contains a decomposable material which can be decomposed by an action of the photocatalyst by energy irradiation to thereby change the wettability of the photocatalyst containing layer.

Although the acting mechanism of the photocatalyst represented by the below mentioned titanium dioxide in the photocatalyst containing layer is not necessarily clear, it is considered that carriers generated by irradiation with light effect chemical structures of organic materials by a direct reaction with neighboring compounds or by active oxygen species produced in the presence of oxygen or water. In this embodiment, it is considered that these carriers effect on the binder component in the photocatalyst containing layer to change the wettability of its surface.

The photocatalyst, binder and other compositions constituting the photocatalyst containing layer as aforementioned will be explained hereinbelow.

a. Photocatalyst

First, the photocatalyst used in this embodiment will be explained. Examples of the photocatalyst used in this embodiment may include those known as photosemiconductors such as, titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$). One type or mixtures of two or more types selected from these may be used.

In this embodiment, titanium dioxide has a high bandgap energy, is chemically stable, free from any toxicity, and easily available, and is therefore, particularly preferably used. There are an anatase type and a rutile type of titanium dioxide. Though the both types may be used in the present invention, an anatase type titanium dioxide is preferable. Anatase type titanium dioxide has an excitation wavelength of 380 nm or less.

Examples of anatase type titanium dioxide include anatase type titania sol of hydrochloric acid peptisation type (STS-02 (average particle diameter: 7 nm) manufactured by Ishihara Sangyo Kaisha, Ltd., ST-K01 manufactured by Ishihara Sangyo Kaisha, Ltd.), anatase type titania sol of nitric acid peptisation type (TA-15 (average particle diameter: 12 nm) manufactured by Nissan Chemical Industries, Ltd.), and the like.

It is preferable that the particle diameter of the photocatalyst is smaller because a photocatalytic reaction is run effectively. The average particle diameter is preferably 50 nm or less, and it is particularly preferable to use a photocatalyst of 20 nm or less.

The content of the photocatalyst in the photocatalyst containing layer used in this embodiment may be set to be in a range of 5 to 60% by weight and preferably 20 to 40% by weight. Also, the thickness of the photocatalyst containing layer is preferably in a range of 0.05 to 10 µm.

b. Binder

Next, the binder used in this embodiment will be explained. This embodiment may be divided into three types of configurations: a case where the wettability of the photocatalyst containing layer is changed by an action of the photocatalyst on the binder itself (first configuration), a case where the wettability of the photocatalyst containing layer is changed by compounding a decomposable material, which is decomposed by an action of the photocatalyst by energy irradiation and can change the wettability of the photocatalyst containing layer by this, to the photocatalyst containing layer (second configuration), and a case where these two configurations are combined (third configuration). The binder used in the first configuration and the third configuration must have a function to change the wettability of the photocatalyst containing layer by an action of the photocatalyst, and in the second configuration, such function is not particularly required.

Hereinafter, the binder used in the second configuration, that is, first, a binder which function of changing the wettability of the photocatalyst containing layer by an action of the photocatalyst is not particularly required will be explained and next, the binder used in the first configuration and third configuration, that is a binder having a function of changing the wettability of the photocatalyst containing layer by an action of the photocatalyst will be explained.

The binder used in the second configuration, which the function of changing the wettability of the photocatalyst containing layer by an action of the photocatalyst is not particularly required, is not particularly limited as long as it has high bonding energy so that its principal skeleton is not decomposed by the photo-excitation of the photocatalyst. Specifically, polysiloxanes having no organic substituent or a few organic substituents can be listed. These polysiloxanes may be obtained by hydrolysis and polymerization condensation of tetramethoxysilane, tetraethoxysilane, or the like.

When such a binder is used, it is necessary that a decomposable material, which can be decomposed by an action of the photocatalyst by energy irradiation and can change the wettability of the photocatalyst containing layer by this, is contained to the photocatalyst containing layer as an additive.

Next, the binder which is used in the first configuration and third configuration, which the function of changing the wettability of the photocatalyst containing layer by an action of the photocatalyst is required, will be explained. As such a binder, preferable compounds are those having high bonding energy so that their principal skeletons are not decomposed by the photo-excitation of the photocatalyst and having an organic substituent decomposed by an action of the photocatalyst. Examples of these compounds may include (1) organopolysiloxanes which are obtained by hydrolysis and polymerization-condensation of chloro or alkoxysilane or the like by sol-gel reactions and exhibit high strength and (2) organopolysiloxanes obtained by crosslinking reactive silicones which are excellent in water repellency and oil repellency.

In a case of the above (1), organopolysiloxanes which are hydrolysis condensates or co-hydrolysis condensates of one kind or two or more kinds of silicon compounds represented by the following formula are preferable.

$$Y_n SiX_{(4-n)}$$

(Wherein Y represents an alkyl group, a fluoroalkyl group, a vinyl group, an amino group, a phenyl group or an epoxy group, X represents an alkoxyl group, an acetyl group or a halogen and "n" denotes an integer from 0 to 3.) Here, the number of carbon atoms in the group represented by Y is preferably in a range of 1 to 20, and the alkoxy group represented by X is preferably a methoxy group, an ethoxy group, a propoxy group or a butoxy group.

Also, as the binder, polysiloxanes containing a fluoroalkyl group are particularly preferably used. Specifically, hydrolysis condensates or co-hydrolysis condensates of one kind or two or more kinds of the following fluoroalkylsilanes can be listed. Those generally known as fluorine type silane coupling agents may be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$;
$CF_3(CF_2)_7SO_2N(C_2H_5) C_2H_4CH_2Si(OCH_3)_3$

By using the above mentioned polysiloxanes containing a fluoroalkyl group as the binder, the liquid repellency of a non-energy irradiated part of the photocatalyst containing layer is greatly improved and exhibit the function of preventing the adhesion of the metal colloid.

Also, as the reactive silicone of the above (2), compounds having a skeleton represented by the following formula can be listed.

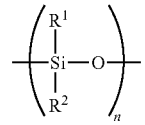

wherein "n" is an integer of 2 or more, $R^1$ and $R^2$ each represent a substituted or unsubstituted alkyl, alkenyl, aryl or cyanoalkyl group of 1 to 10 carbon atoms; 40% or less by mol ratio to the whole is vinyl, phenyl and phenyl halide. Also, $R^1$ and $R^2$ are preferably a methyl group because the surface energy is the lowest, and 60% or more by mol ratio is preferably a methyl group. Also, these compounds have at least one reactive group such as a hydroxyl group in a molecular chain at a chain terminal or side chain.

Also, a stable organosilicon compound which does not crosslink, such as a dimethylpolysiloxane, may be compounded in the binder, together with the above organopolysiloxane.

(Decomposable Material)

In the second configuration and third configuration, it is necessary to further compound a decomposable material, which can be decomposed by an action of the photocatalyst by energy irradiation and can change the wettability of the photocatalyst containing layer by this, in the photocatalyst containing layer. That is, in a case where the binder itself has no function to change the wettability of the photocatalyst containing layer, or in a case where such function is not enough, the above mentioned decomposable material is added to cause a change in the wettability of the photocatalyst containing layer or to help to promote such a change.

Examples of such a decomposable material may include surfactants which are decomposed by an action of the photocatalyst and has a function to change the wettability of the surface of the photocatalyst containing layer by being decomposed. Specifically, nonionic surfactants of hydrocarbon types such as each series of NIKKOL BL, BC, BO and BB manufactured by Nikko Chemicals Co., Ltd., fluorine types such as ZONYL FSN and FSO manufactured by Du Pont Kabushiki Kaisha, SURFLON S-141 and 145 manufactured by Asahi Glass Company, MEGAFACE F-141 and 144 manufactured by Dainippon Ink and Chemicals, Incorporated, FTARGENT F-200 and F251 manufactured by NEOS Co., Ltd., UNIDYNE DS-401 and 402 manufactured by DAIKIN INDUSTRIES, LTD., and FLUORAD FC-170 and 176 manufactured by 3M, and silicone type surfactants can be listed. Cationic surfactants, anionic surfactants and amphoteric surfactants may also be used.

Besides the surfactants, oligomers and polymers such as a polyvinyl alcohol, unsaturated polyester, acryl resin, polyethylene, diallyl phthalate, ethylenepropylenediene monomer, epoxy resin, phenol resin, polyurethane, melamine resin, polycarbonate, polyvinyl chloride, polyamide, polyimide, styrenebutadiene rubber, chloroprene rubber, polypropylene, polybutylene, polystyrene, polyvinylacetate, nylon, polyester, polybutadiene, polybenzimidazole, polyacrylonitrile, epichlorohydrin, polysulfide, polyisoprene, and the like can be listed.

(Containment of Fluorine)

Also, in this embodiment, the photocatalyst containing layer is preferably formed such that the photocatalyst containing layer contains fluorine and the fluorine content in the surface of the photocatalyst containing layer is reduced by an action of the photocatalyst when energy is irradiated to the photocatalyst containing layer, as compared to that before energy irradiation.

The photocatalyst containing layer having such properties makes it possible to form a pattern, comprising a part with low fluorine content, with ease by pattern irradiation of energy as will be described later. Here, fluorine has an extremely low surface energy, and therefore, the surface of a substance containing a lot of fluorine has lower critical surface tension. Therefore, the critical surface tension of the surface of a part having small fluorine content is larger than that of the surface of a part having large fluorine content. This specifically means that the part having small fluorine content is a more lyophilic area than the part having large fluorine content. As a consequence, the formation of a pattern comprising a part having smaller fluorine content than the surrounding surface leads to the result that a pattern comprising a lyophilic area is formed in a liquid repellent area.

Therefore, in a case of using such a photocatalyst containing layer, a pattern of lyophilic area can be easily formed in liquid repellent area by pattern irradiation of energy. Therefore, even in a case of coating the metal colloid on the entire surface, the metal colloid can be adhered only to this lyophilic area to make a conductive pattern forming body with ease and therefore, a highly precise conductive pattern can be formed at a low cost.

Examples of a method of compounding fluorine in the photocatalyst containing layer may include a method in which a fluorine compound is bound to a main agent usually having a high bonding energy with relatively weak bonding energy, and a method in which a fluorine compound, which is bound with relatively weak bonding energy, is mixed into the photocatalyst containing layer. This is because the introduction of fluorine by such a method ensures that the fluorine-bound part having relatively small bonding energy is first decomposed, whereby fluorine can be removed from the photocatalyst containing layer when energy is irradiated.

The above mentioned first method, namely, a method in which a fluorine compound is bound to the binder, having high bonding energy, with relatively weak bonding energy may include a method in which a fluoroalkyl group is introduced as a substituent into the above organopolysiloxane.

For example, as a method for obtaining an organopolysiloxane, as described in the above (1), an organopolysiloxane exhibiting high strength may be obtained by hydrolysis and polymerization-condensation of chloro or alkoxysilane or the like by sol-gel reaction.

Here, in this method, as aforementioned, the organopolysiloxane is obtained by hydrolysis condensation or co-hydrolysis condensation of one kind or two or more kinds of silicon compounds represented by the above formula, that is;

$Y_nSiX_{(4-n)}$ (Wherein Y represents an alkyl group, a fluoroalkyl group, a vinyl group, an amino group, a phenyl group or an epoxy group, X represents an alkoxyl group, an acetyl group or a halogen and "n" denotes an integer from 0 to 3.) In the formula, by synthesizing using a silicon compound having a fluoroalkyl group as the substituent Y, an organopolysiloxane having a fluoroalkyl group as a substituent can be obtained. When such an organopolysiloxane having a fluoroalkyl group as the substituent is used as the binder, since the part of carbon bonding of the fluoroalkyl group is decomposed by an action of the photocatalyst, it is possible to decrease the fluorine content of the part irradiated with energy on the surface of the photocatalyst containing layer.

Although silicon compound having an fluoroalkyl group used in this case is not particularly limited as long as it has a fluoroalkyl group, silicon compounds which have at least one fluoroalkyl group and the number of the carbon atoms of this fluoroalkyl group is 4 to 30, preferably 6 to 20, and particularly preferably 6 to 16, are preferably used. Specific examples of such a silicon compound are as aforementioned. However, among the above, silicon compounds having fluoroalkyl group whose number of carbon atoms is 6 to 8, namely, fluoroalkylsilanes are preferable.

In this embodiment, such a silicon compound having a fluoroalkyl group may be used as a mixture with the above mentioned silicon compound having no fluoroalkyl group, and a co-hydrolysis condensate of these may be used as the above organopolysiloxane. Using one kind or two or more kinds of such silicon compounds having a fluoroalkyl group, hydrolysis condensates or co-hydrolysis condensates of these may be used as the above organopolysiloxane.

In accordingly obtained organopolysiloxane having a fluoroalkyl group, among the silicon compound constituting this organopolysiloxane, the silicon compound having a fluoroalkyl group is preferably contained by 0.01 mol % or more, and more preferably 0.1 mol % or more.

This reason is that when the fluoroalkyl group is contained to the above extent, the liquid repellency of the photocatalyst containing layer can be improved and it is therefore possible to increase a difference in wettability from the part made to be a lyophilic area by irradiating energy.

Also, in the method shown in the above (2), an organopolysiloxane is obtained by crosslinking reactive silicone having high liquid repellency. In this case, similarly, one or both of $R^1$ and $R^2$ in the above formula are a substituent containing a fluorine such as a fluoroalkyl group whereby fluorine can be compounded in the photocatalyst containing layer. Also, when energy is irradiated, the part of the fluoroalkyl group, of which the bonding energy is smaller than the siloxane bonding, is decomposed, and it is therefore, possible to decrease the fluorine content on the surface of the photocatalyst containing layer by energy irradiation.

In the meantime, the latter example, that is, the method of introducing a fluorine compound which is bound with energy lower than the bonding energy of the binder include a method in which a fluorine type surfactant is mixed as the decomposable material as mentioned above. Also, as a method for introducing a high molecular weight fluorine compound, a method in which a fluororesin having high compatibility to a binder resin is mixed, can be listed.

As regards the fluorine content contained in the above mentioned photocatalyst containing layer containing fluorine, the fluorine content of the low fluorined content lyophilic area which is formed by energy irradiation, is preferably 10 or less, more preferably 5 or less, and particularly preferably 1 or less when the fluorine content of the non-energy irradiated part is defined as 100.

This is because a large difference in lyophilic properties between an energy irradiated part and a non-energy irradiated part can be caused by setting the fluorine content in the above range. Therefore by forming the conductive pattern on such photocatalyst containing layer, a conductive pattern can be precisely formed only in the lyophilic area where fluorine content is reduced, and the conductive pattern forming body can be obtained with high precision. It is to be noted that the reducing rate is on a weight basis.

The fluorine content in the photocatalyst containing layer may be measured by various methods which are generally used. It is not particularly limited as long as it is a method which can measure the quantity of fluorine on the surface quantitatively, for example, an X-ray photoelectron spectroscopy, ESCA (also called Electron Spectroscopy for Chemical Analysis), fluorescent X-ray analysis, and mass spectrometry.

In this embodiment, titanium dioxide is preferably used as the photocatalyst as aforementioned. As the fluorine content contained in the photocatalyst containing layer, when titanium dioxide is accordingly used, is as follows when analyzing by an X-ray photoelectron spectroscopy to quantitate. It is desirable that fluorine (F) element is contained in the surface of the photocatalyst containing layer in a ratio of 500 or more, preferably 800 or more, and particularly preferably 1200 or more, when the content of titanium (Ti) element is defined as 100.

This reason is that when fluorine (F) is contained in the photocatalyst containing layer to the above extent, the critical surface tension of the surface of the photocatalyst containing layer can be sufficiently dropped, so that the liquid repellency of the surface can be secured. And this makes it possible to increase a difference in wettability from the surface of the lyophilic area on the pattern part which is reduced in fluorine content by pattern-energy irradiation whereby the precision of the conductive pattern forming body finally obtained can be improved.

As to the fluorine content in the lyophilic area formed by pattern energy irradiation in such conductive pattern forming body, a fluorine (F) is preferably contained in a ratio of 50 or less, more preferably 20 or less, and particularly preferably 10 or less, when the content of titanium (Ti) element is defined as 100.

If the fluorine content in the photocatalyst containing layer can be reduced to the above extent, lyophilic properties enough to form a conductive pattern can be obtained, which makes it possible to form a conductive pattern with high precision due to a difference in wettability from the liquid repellent area which is the non-energy irradiated part, and a conductive pattern forming body having high utility value can be obtained.

c. Method for Manufacturing the Photocatalyst Containing Layer

As mentioned above, when the organopolysiloxane is used as the binder, the photocatalyst containing layer may be formed by dispersing the photocatalyst and the organopolysiloxane as the binder together with other additives, as needed, into a solvent to prepare a coating solution, and by coating the coating solution to a base material. As the solvent to be used, an alcohol type organic solvent such as ethanol or isopropanol is preferable. The coating solution may be coated by a known coating method such as a spin coating, spray coating, dip coating, roll coating or beads coating. In a case where an ultraviolet curing type component is contained as the binder, the photocatalyst containing layer may be formed by irradiating ultraviolet rays to carry out curing treatment.

(Base Material)

In this embodiment, as shown in FIG. 1, a pattern forming body substrate 3 comprises at least a base material 1 and a photocatalyst containing layer 2 formed on the base material 1.

In this case, the material constituting the base material to be used is selected properly according to, for example, the direction of energy irradiation in the below mentioned wettability pattern forming process and depending on whether or not the transparency is required to the obtained conductive pattern forming body. That is, when irradiated from the photocatalyst containing layer side, transparency is not required to the base material. However, when energy is irradiated from the base material side, the base material must be transparent.

Also, the base material to be used in this embodiment may be those having flexibility, for example, a resin film, or may be those having no flexibility, for example, a glass substrate.

A primer layer may be formed on the base material to improve the adhesion between the surface of the base material and the photocatalyst containing layer. Examples of materials used for the primer layer may include silane type and titan type coupling agents.

(Light Shielding Part)

As the pattern forming body substrate used in this embodiment, a substrate provided with a light shielding part formed in a pattern may be used. In a case where the substrate is provided with such a light shielding part, it is not necessary to use a photomask when the substrate is irradiated with energy and it is also not necessary to carry out laser beam drawing irradiation. Therefore, because the alignment of the pattern forming body substrate with a photomask is not necessary, the process can be simple. Also, because an expensive device required for drawing irradiation is not necessary, there is a merit that it is advantageous in light of cost.

As regards the position where the light shielding part is formed, there are a case where the light shielding part is formed on the base material and the photocatalyst containing layer is formed thereon, that is, a case where it is formed in between the base material and the photocatalyst containing layer, and a case where the light shielding part is formed in a pattern on the surface of the base material on the side which the photocatalyst containing layer is not formed.

In either case, energy is irradiated from the base material side. A wettability pattern can be formed in a pattern on the surface of the photocatalyst containing layer by irradiating the entire surface.

The method for forming such a light shielding part is not particularly limited, and an appropriate method is selected according to the properties of the surface on which the light shielding part is formed and to required energy shielding properties.

For example, a thin film of a metal such as chromium may be formed into a thickness of about 1000 to 2000 Å by a sputtering method or vacuum deposition method, and patterned to form the light shielding part. As this patterning method, usual patterning method such as sputtering may be used.

Also, it may be a method in which a layer containing light shielding particles such as a carbon fine particle, metal oxide, inorganic pigment, and organic pigment, in a resin binder is formed in a pattern. As the resin binder to be used, one kind or a mixture of two or more kinds of resins such as a polyimide resin, acryl resin, epoxy resin, polyacrylamide, polyvinyl alcohol, gelatin, casein and cellulose, or photosensitive resins, further, O/W emulsion type resin compositions, for example, emulsified reactive silicone may be used. The thickness of such resin light shielding part may be set to be in a range of 0.5 to 10 μm. As a method for patterning such a resin light shielding part, usually used methods such as a photolithographic method and printing method may be used.

(2) Wettability Pattern Forming Process

In this embodiment, a wettability pattern forming process is carried out next, wherein the surface of the photocatalyst containing layer is pattern irradiated with energy from a predetermined direction to form a wettability pattern comprising a lyophilic area and a liquid repellent area on the surface of the photocatalyst containing layer.

The term "energy irradiation" (exposure) meant in this embodiment is a concept including irradiation with any energy ray capable of changing the wettability of the surface of the photocatalyst containing layer and is not limited to irradiation with visible light.

Generally, the wavelength of the light used for the energy irradiation is preferably set in a range of 400 nm or less, more preferably 380 nm or less. This is because the preferable photocatalyst used in the photocatalyst containing layer is titanium dioxide as aforementioned, and light having the above wavelength is preferable as the energy activating a photocatalytic action by this titanium dioxide.

Examples of a light source used for the energy irradiation may include a mercury lamp, metal halide lamp, xenon lamp, eximer lamp, and other various light sources.

A method in which pattern irradiation via a photomask is carried out by using the above mentioned light sources, or a method in which drawing irradiation is carried out in a pattern by using a laser such as an excimer laser or YAG laser, may be used.

The amount of energy to be irradiated when energy is irradiated is set to be the irradiating amount required for changing the wettability of the surface of the photocatalyst containing layer by an action of the photocatalyst contained in the photocatalyst containing layer.

In this case, it is possible to raise sensitivity by irradiating energy while heating the photocatalyst containing layer. This is preferable in the point that the wettability can be changed efficiently. Specifically, the photocatalyst containing layer is preferably to be heated at a temperature in a range of 30° C. to 80° C.

As mentioned above, the direction of energy irradiation in this embodiment, when the base material is transparent, pattern energy irradiation via a photomask or laser drawing irradiation may be carried out from either direction of the base material side or the photocatalyst containing layer side. On the other hand, when the base material is opaque, energy irradiation must be carried out from the photocatalyst containing layer side, and when the light shielding part is formed, energy irradiation must be carried out from the base material side.

(3) A Metal Colloid Coating Process

In this embodiment, a metal colloid coating process is carried out next wherein a metal colloid is coated to the entire surface of the pattern forming body substrate, on which the wettability pattern is formed, to adhere the metal colloid only to a lyophilic area.

The coating of the metal colloid is not particularly limited as long as the metal colloid can be coated to the surface of the photocatalyst containing layer. Specifically, it may be methods, such as a dip coating method or spin coating method, in which the entire surface of the property variable layer is coated and methods, such as a nozzle discharging method, in which the metal colloid is coated in an intended pattern. Also, among the nozzle discharging methods, ink jet method is preferable in view of high manufacturing efficiency.

The viscosity of the metal colloid used in this embodiment is preferably in a range of 1 to 100 cps, more preferably 5 to 50 cps, and particularly preferably 10 to 20 cps. The concentration is preferably in a range of 1 to 70 wt %, more preferably 10 to 50 wt %, and particularly preferably 20 to 30 wt %. When the viscosity and the concentration are lower than the above range, this is undesirable because the layer thickness of the resulting metal pattern is too thin and it may be difficult to put it into practical use, though depending on use. On the other hand, when the viscosity and the concentration are higher than the above range, this is undesirable because there is the possibility that patterning cannot be accomplished when such metal colloid is applied to the entire surface.

The surface tension of the metal colloid is preferably 20 mN/m or more, more preferably 50 mN/m or more, and particularly preferably 70 mN/m or more. When the surface tension is lower than the above range, this is undesirable because there is the possibility that the contact angle of the liquid repellent area cannot be made to be large with the result that there is the possibility of the metal colloid being left also in the liquid repellent area. Although there is no particular limitation to the upper limit of the surface tension of the metal colloid, the upper limit is preferably 80 mN/m or less.

As aforementioned, the metal colloid used in this embodiment is preferably a solution having high surface tension. This reason is that when coated to the entire surface as aforementioned, the metal colloid coated to the liquid repellent area, other than the lyophilic area, must be removed, or concentrated in the lyophilic area. And for this, the contact angle of the liquid repellent area with the metal colloid is preferably large. In this embodiment, a metal colloid using water as a medium is preferably used from this point of view.

The type of metal used for the metal colloid in this embodiment is preferably silver or gold. This is because these have good conductivity and corrosion resistance.

Therefore, in this embodiment, a gold colloid or silver colloid using water as a medium is preferably used.

(4) Conductive Pattern Forming Process

In this embodiment, a conductive pattern forming process is finally carried out wherein the metal colloid adhered to the lyophilic area of the photocatalyst containing layer is solidified to make a conductive pattern, thereby finally making the pattern forming body substrate into a conductive pattern forming body.

As the solidifying method used here, heating is most general. The metal colloid is heated at temperatures in a range of 100° C. to 700° C., and preferably 250° C. to 500° C. Heating time is in a range of 10 minutes to 60 minutes and preferably 20 minutes to 40 minutes.

(5) Non-Drawn Part Removing Process

The method for manufacturing a conductive pattern forming body in this embodiment may comprise, other than the above processes, a non-drawn part removing process wherein a non-conductive pattern part where no conductive pattern part is formed is removed. When the aforementioned photocatalyst containing layer is conductive, it is difficult to make a conductive pattern forming body even if a conductive pattern is provided on the conductive pattern forming body. Therefore, the photocatalyst containing layer of the non-conductive pattern part is removed to bare the base material, thereby making a conductive pattern forming body. In this case, it is necessary that the base material is an insulation material among the aforementioned materials.

Here, the conductive pattern part means a part where a conductive pattern, which is formed in the aforementioned conductive pattern forming process, is formed. And the non-conductive pattern part means a part other than the part, where the conductive pattern part is formed on the photocatalyst containing layer, where the photocatalyst containing layer is bared on the surface.

Figure 2A:
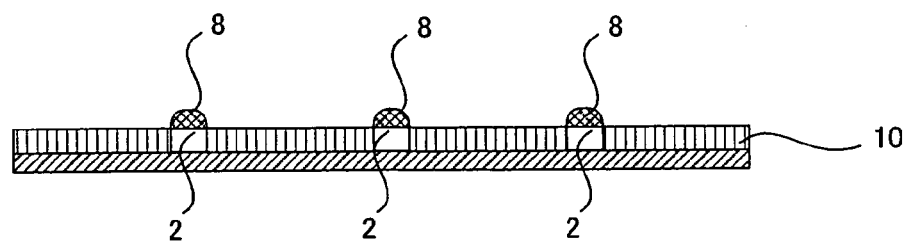
FIGS. 2a and 2b are process diagrams showing one example of a non-drawn part removing process of a method for manufacturing a conductive pattern forming body according to the present invention.
Figure 2B:
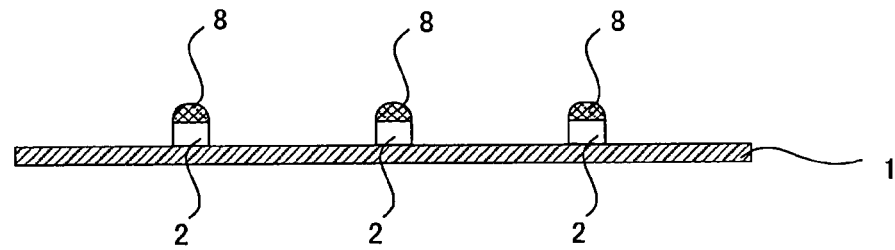

The non-drawn part removing process in this embodiment is a process of removing non-drawn part 10 (FIG. 2*b*) comprising the photocatalyst containing layer bared on the surface of an area other than the conductive pattern 8 area of the pattern forming body substrate (FIG. 2*a*) formed in the above conductive pattern forming process. The method is not particularly limited as long as the method can remove the non-drawn part 10 and can bare the base material 1.

Specific methods for removing this non-drawn part include a method in which an alkali solution or a strong acid such as hydrofluoric acid or concentrated sulfuric acid is coated by a spray or dipped.

(6) Others

In this embodiment, the conductive pattern forming body may be subjected to electroplating to increase the layer thickness of the conductive pattern. This is because, by doing so, the resistance of the conductive pattern can be reduced and at the same time, the strength of adhesion of the conductive pattern to the photocatalyst containing layer can be improved, leading to the formation of a high quality and highly precise wiring board.

Also, in this embodiment, a protective layer may be formed on the resulting conductive pattern from the viewpoint of, for example, improving the adhesion of the resulting conductive pattern to the base material.

2. Second Embodiment

Next, the second embodiment of the method for manufacturing a conductive pattern forming body according to the present invention will be explained. The method for manufacturing a conductive pattern forming body in this embodiment comprises:

a process of preparing a pattern forming body substrate comprising a base material, a photocatalyst treatment layer formed on the base material containing at least a photocatalyst, and a wettability variable layer formed on the photocatalyst treatment layer which is a layer whose wettability of an energy irradiated part is changed so as a contact angle to a liquid is reduced;

a process of forming wettability pattern comprising a liquid repellent area and a lyophilic area on the wettability variable layer by irradiating the wettability variable layer in a pattern with energy;

a metal colloid coating process of adhering a metal colloid only to the lyophilic area of the surface of the wettability variable layer on which the wettability pattern is formed, by coating the metal colloid; and a process of forming a conductive pattern by solidifying the metal colloid adhered to the lyophilic area of the wettability pattern.

As aforementioned, in the method for manufacturing a conductive pattern forming body in this embodiment, a pattern wherein an energy irradiated part is made to be a lyophilic area and a non-energy irradiated part is made to be a liquid repellent area, can be easily formed by irradiating energy in a pattern to the wettability variable layer. The metal colloid can be adhered only to the lyophilic area formed in a pattern and a conductive pattern forming body can be easily formed by solidifying the metal colloid.

Figure 3A:
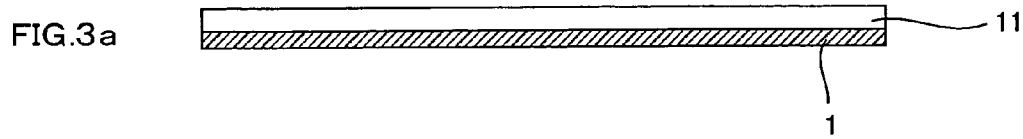
FIG. 3a to 3e are process diagrams showing another example of a method for manufacturing a conductive pattern forming body according to the present invention.
Figure 3B:
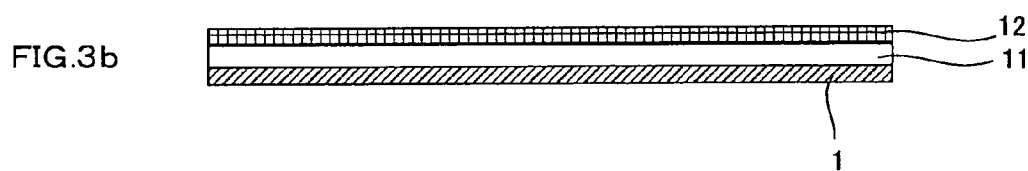
Figure 3C:
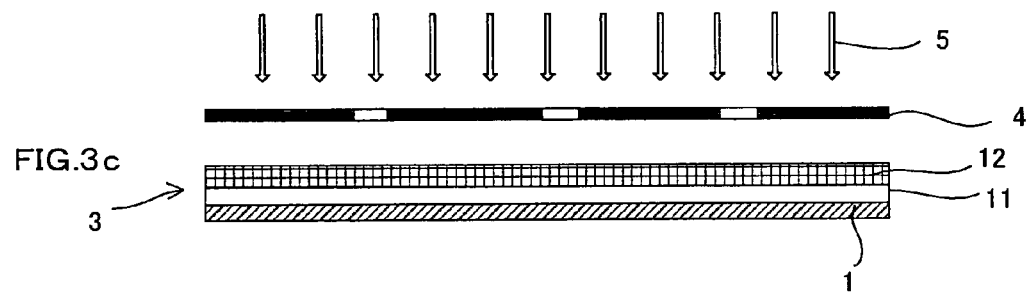
Figure 3D:
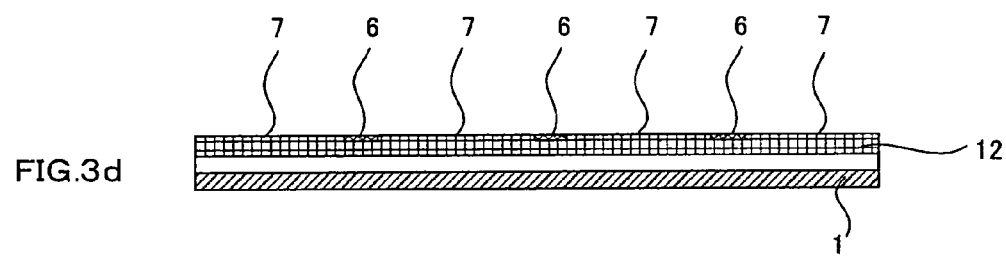

In the method for manufacturing such a conductive pattern forming body, as shown in FIG. 3 as an example, a photocatalyst treatment layer 11 is formed on a base material 1 (see FIG. 3a). Next, a wettability variable layer 12 is formed on the photocatalyst treating later 11 (see FIG. 3b). A photomask 4 on which a necessary pattern is drawn is placed on the wettability variable layer 12 as shown in FIG. 3c, and ultraviolet light 5 is irradiated via the photomask 4. As shown in FIG. 3d, a wettability pattern comprising a lyophilic area 6 and a liquid repellent area 7 is thereby formed on the surface of the wettability variable layer 12 (wettability pattern forming process).

Figure 3E:
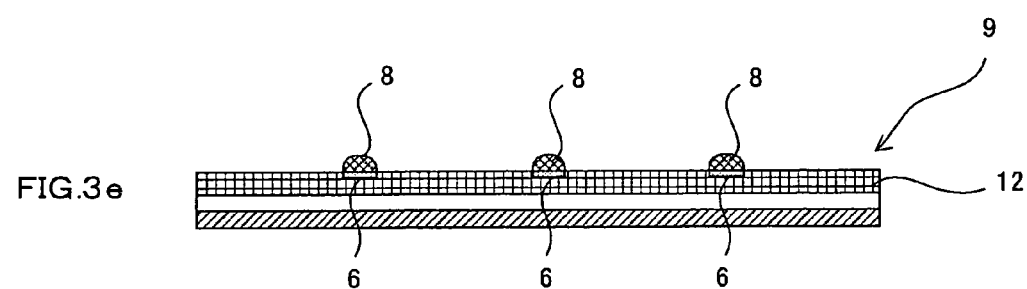

Next, a metal colloid is coated to the surface of the wettability variable layer 12 to adhere the metal colloid only to the lyophilic area 6 (a metal colloid coating process), and the metal colloid is solidified to form a conductive pattern (see FIG. 3e, conductive pattern forming process).

The method for manufacturing a conductive pattern forming body in this embodiment will be hereinafter explained by each process.

(1) Pattern Forming Body Substrate Preparing Process

First, a pattern forming body substrate preparing process in this embodiment will be explained. The pattern forming body substrate preparing process in this embodiment is a process of preparing pattern forming body substrate comprising a base material, a photocatalyst treatment layer formed on the base material which contains at least a photocatalyst, and a wettability variable layer formed on the photocatalyst treatment layer which is a layer whose wettability of an energy irradiated part is changed so as a contact angle to a liquid is reduced. Each configuration will be explained hereinbelow.

(Photocatalyst Treatment Layer)

The photocatalyst treatment layer in this embodiment contains at least a photocatalyst. When the photocatalyst treatment layer contains a binder, it is the same as the photocatalyst containing layer explained in the first embodiment, therefore, explanations is omitted here. In the second embodiment, however, the wettability of the photocatalyst treatment layer is not necessary changed. Therefore, even in a case where a change in wettability by an action of the photocatalyst on the binder itself is not caused, it is not necessary to compound any decomposable material in the photocatalyst treatment layer like the case of the first embodiment. Also, the method for manufacturing the photocatalyst treatment layer, when it contains a binder, is the same as that of the aforementioned first embodiment. Therefore, explanations are omitted.

In the meantime, examples of a method for forming the photocatalyst treatment layer in a case of containing no binder may include methods using a vacuum film forming method such as a sputtering method, CVD method, and vacuum deposition method. A photocatalyst treatment layer having an even layer and containing only the photocatalyst can be formed by forming it by a vacuum film forming method. This makes it possible to change the wettability of the wettability variable layer evenly. Also, since the photocatalyst treatment layer is made only of the photocatalyst, it is possible to change the wettability of the wettability variable layer more efficiently than in a case of using the binder.

Also, other examples of the method of forming the photocatalyst treatment layer made only of the photocatalyst include a method in which, when the photocatalyst is titanium dioxide, amorphous titania is formed on a base material and is then phase-changed to crystal titania by baking. The amorphous titania to be used here can be obtained by hydrolysis and dehydration-condensation of an inorganic salt of titanium such as titanium tetrachloride and titanium sulfide, or by hydrolysis and dehydration-condensation of an organic titanium compound, in the presence of an acid, such as tetraethoxytitanium, tetraisopropoxytitanium, tetra-n-propoxytitanium, tetrabutoxytitanium or tetramethoxytitanium. Then, it is denatured into an anatase type titania by baking at 400° C. to 500° C., and may be denatured into a rutile type titania by baking at 600° C. to 700° C.

(Wettability Variable Layer)

Next, the wettability variable layer will be explained. In this embodiment, it is not necessary to compound the photocatalyst in the wettability variable layer. Therefore, the possibility of the conductive pattern being affected by the photocatalyst with time can be decreased and it is therefore possible to form a high quality conductive pattern forming body.

Although there is no particular limitation to the wettability variable layer as long as it is a layer whose wettability is changed by an action of the photocatalyst treatment layer, it is preferable that it is formed of the same material as the binder contained in the photocatalyst treatment layer used in the first embodiment. The material and the method for forming the wettability variable layer in a case of forming with the same material as the binder contained in the photocatalyst containing layer of the first embodiment are the same as those in the first embodiment, therefore, explanations of them are omitted.

In this embodiment, the thickness of the wettability variable layer is preferably in a range of 0.001 μm to 1 μm, and particularly preferably in a range of 0.01 to 0.1 μm, in relation to the rate of change in wettability caused by the photocatalyst.

In this embodiment, by the use of the wettability variable layer having the aforementioned components, an energy irradiated part can be made into to a lyophilic area by changing the wettability and can make a large difference in wettability from that of an non-energy irradiated part, by utilizing action of oxidation or decomposition of organic groups or additives which are a part of the above components by an action of the photocatalyst in the neighboring photocatalyst treatment layer. As a consequence, it is possible to form a conductive pattern forming body having high utility value by improving acceptability (lyophilic properties) and repellency (liquid repellency) to the metal colloid.

The wettability variable layer in this embodiment preferably has a contact angle to the metal colloid of 50° or more, more preferably 60° or more, and particularly preferably 70° or more, in a non-energy irradiated part, that is, a liquid repellent area. This is because the non-energy irradiated part, in this embodiment, is the part of which liquid repellency is demanded, liquid repellency is not sufficient when the contact angle to a liquid is small, leading to a possibility that the metal colloid is left even in an area where a conductive pattern is not formed, when the metal colloid is coated to the entire surface in the below mentioned metal colloid coating process, which is undesirable.

Also, the wettability variable layer preferably has a contact angle to the metal colloid of 40° or less, more preferably 30° or less, and particularly preferably 20° or less, in a part where energy is irradiated, namely a lyophilic area. This reason is that in a case where the contact angle to the metal colloid is high in a part where energy is irradiated, namely the lyophilic area, there is the possibility of the metal colloid being repelled even in the lyophilic area when coating the metal colloid to the entire surface, and there is the possibility of being difficult to pattern the lyophilic area with the metal colloid.

The wettability variable layer may contain the same fluorine as in the same manner as that described in the paragraph "Containment of fluorine" in the explanations of the photocatalyst containing layer in the above first embodiment.

(2) Wettability Pattern Forming Process

Next, a wettability pattern forming process in this embodiment will be explained. The wettability pattern forming process in this embodiment is a process of forming wettability pattern comprising a lyophilic area and a liquid repellent area on the surface of the aforementioned wettability variable layer by irradiating the wettability variable layer in a pattern with energy from a predetermined direction. The type of energy, the method of irradiating energy and the like in this wettability pattern forming process are the same as those in the wettability pattern forming process in the first embodiment, therefore, explanations are omitted here.

(3) Metal Colloid Coating Process

Next, a metal colloid coating process will be explained. The a metal colloid coating process in this embodiment is a process of adhering a metal colloid only to the lyophilic area among the wettability pattern comprising the lyophilic area and the liquid repellent area which is formed in the wettability pattern forming process.

The metal colloid and the coating method in the metal colloid coating process in this embodiment are the same as those in the metal colloid coating process in the first embodiment, therefore, explanations are omitted here.

(4) Conductive Pattern Forming Process

Next, a conductive pattern forming process is carried out wherein the metal colloid adhered only to the wettability pattern-like lyophilic area in the above metal colloid coating process is solidified. The method of solidifying the metal colloid and the like in this conductive pattern forming process are the same as those in the conductive pattern forming process in the first embodiment, therefore, explanations are omitted here.

(5) Non-Drawn Part Removing Process

In this embodiment, a non-drawn part removing process, wherein a non-conductive pattern part where no conductive pattern has been formed is removed, may be comprised after the conductive pattern forming process. When the wettability variable layer is conductive, it is difficult to form a conductive pattern forming body even if a conductive pattern is provided. Therefore, the photocatalyst treatment layer is bared by removing the non-conductive pattern part to form a conductive pattern forming body. Also, the non-drawn part removing process in this embodiment may be a process of removing the wettability variable layer and the photocatalyst treatment layer, when the wettability variable layer and the photocatalyst treatment layer are made of conductive materials. Here, the non-conductive pattern part is a part where conductive pattern is not formed on the wettability variable layer, and the wettability variable layer is bared on the surface.

The non-drawn part removing process in this embodiment is also the same as the non-drawn part removing process in the first embodiment, therefore, explanations are omitted here.

(6) Others

In this embodiment, the conductive pattern forming body may be further subjected to electroplating to increase the layer thickness of the conductive pattern. By doing so, the resistance of the conductive pattern can be reduced, and at the same time, the strength of adhesion of the conductive pattern to the wettability variable layer can be improved, leading to the formation of a high quality and highly precise wiring board.

Also, in this embodiment, a protective layer may be formed on the resulting conductive pattern from the viewpoint of, for example, improving the adhesion of the resulting conductive pattern to the base material.

3. Third Embodiment

Next, a third embodiment of the method for manufacturing a conductive pattern forming body according to the present invention will be explained. The method for manufacturing a conductive pattern forming body in this embodiment comprises:

a process of preparing pattern forming body substrate comprising a base material, a photocatalyst treatment layer formed on the base material containing at least a photocatalyst, and a decomposition removal layer formed on the photocatalyst treatment layer which is decomposed and removed by an action of the photocatalyst by energy irradiation;

a decomposition removal pattern forming process of forming a decomposition removal pattern on the decomposition removal layer by irradiating the decomposition removal layer in a pattern with energy;

a metal colloid coating process of adhering a metal colloid in a pattern to the surface of the decomposition removal layer on which the decomposition removal pattern is formed, by coating the metal colloid; and a process of forming a conductive pattern by solidifying the metal colloid adhered in a pattern.

According to the method for manufacturing a conductive pattern forming body in this embodiment, the decomposition removal layer is decomposed and removed in a pattern by an action of the photocatalyst by irradiating the decomposition removal layer in a pattern with energy, so that it is possible to form a pattern having irregularities on the surface. By utilizing these irregularities, the metal colloid can be adhered in a pattern with ease by coating the metal colloid by, for example, an ink jet method. Also, the decomposition removal layer in this embodiment preferably has the properties that a contact angle of the decomposition removal layer to the metal colloid is different from a contact angle of the base material, bared by removing the decomposition removal layer, to the metal colloid. By this, the metal colloid can be adhered in a pattern by utilizing not only the above irregularities but also a difference in wettability.

Figure 4A:
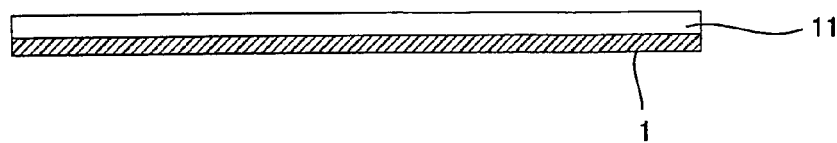
FIG. 4a to 4e are process diagrams showing another example of a method for manufacturing a conductive pattern forming body according to the present invention.
Figure 4B:
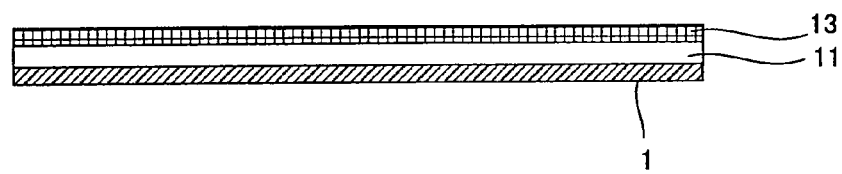
Figure 4C:
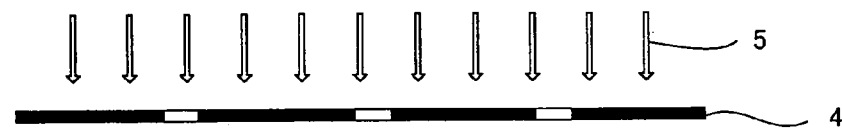
Figure 4C:
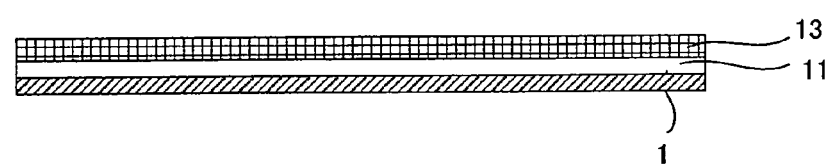
Figure 4D:
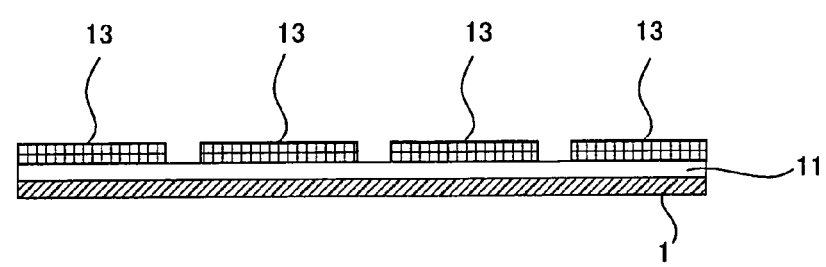

In the method for manufacturing a conductive pattern forming body as aforementioned, as shown in FIG. 4, a photocatalyst treatment layer 11 is formed on a base material 1 (see FIG. 4a). Next, a decomposition removal layer 13 is formed on the photocatalyst treatment layer 11 (see FIG. 4b). A photomask 4 on which a necessary pattern has been drawn is placed on the decomposition removal layer 13 as shown in FIG. 4c, and an ultraviolet light 5 is irradiated via the photomask 4. By this treatment, the decomposition removal layer 13 is decomposed and removed in a pattern as shown in FIG. 4d, and resulting in the formation of a decomposition removal pattern comprising an area where the decomposition removal layer 13 is remaining and an area where the photocatalyst treatment layer 11 is bared (decomposition removal pattern forming process).

Figure 4E:
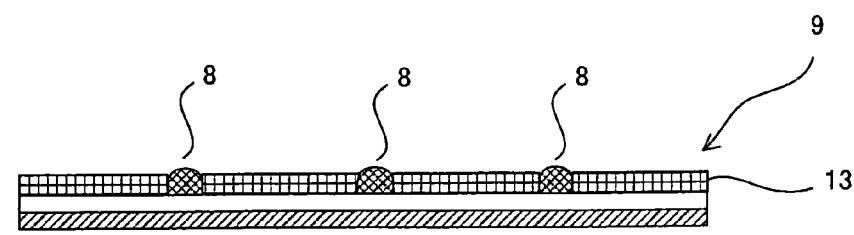

Next, a metal colloid is coated to the area where the photocatalyst treatment layer 11 is bared to adhere the metal colloid only to the above area (metal colloid coating process), and the metal colloid is then solidified to form a conductive pattern 8, thereby forming a conductive pattern forming body 9 (see FIG. 4e, conductive pattern forming process).

As regards the method for manufacturing a conductive pattern forming body in this embodiment, each process will be explained.

(1) Pattern Forming Body Substrate Preparing Process

First, the pattern forming body substrate preparing process in this embodiment will be explained. The pattern forming body substrate preparing process in this embodiment is a process of preparing pattern forming body substrate comprising a base material, a photocatalyst treatment layer formed on the base material containing at least a photocatalyst, and a decomposition removal layer formed on the photocatalyst treatment layer which is decomposed and removed by an action of a photocatalyst by energy irradiation. Each configuration will be explained hereinbelow.

(Photocatalyst Treatment Layer)

The photocatalyst treatment layer in this embodiment is the same as that explained in the second embodiment, therefore, explanations are omitted here.

(Decomposition Removal Layer)

Next, the decomposition removal layer will be explained. There is no particular limitation to the decomposition removal layer used in this embodiment as long as a part of the decomposition removal layer which is irradiated with energy is decomposed and removed by an action of a photocatalyst contained in the photocatalyst treatment layer when irradiated with energy.

As aforementioned, since an energy irradiated part of the decomposition removal layer is decomposed and removed by an action of a photocatalyst, it is possible to form a pattern comprising a part where the decomposition removal layer is present and a part where the decomposition removal layer is not present, that is, a pattern having irregularity, without carrying out a developing process and a cleaning process.

Although this decomposition removal layer is removed without carrying out any particular after treatment such as a developing process and cleaning process because it is, for example, oxidizatioally decomposed or vaporized by an action of the photocatalyst by energy irradiation, a cleaning process and the like may be carried out though depending on the material of the decomposition removal layer.

Also, the decomposition removal layer used in this embodiment is preferably not only forms irregularities but also has a higher contact angle to the metal colloid than the surface of the base material. This is because the decomposition removal layer is thereby decomposed and removed, and an area where the base material is bared can be made into a lyophilic area, and an area where the decomposition removal layer remains can be made into a liquid repellent area, enabling the formation of various patterns.

Here, the decomposition removal layer, namely, the liquid repellent area in this embodiment preferably has a contact angle to the metal colloid of 50° or more, more preferably 60° or more, and particularly preferably 70° or more. This is because the non-energy irradiated part is the part of which liquid repellency is demanded in this embodiment, and liquid repellency is therefore not sufficient when the contact angle to a liquid is small. That is not preferable that there is the possibility of the metal colloid being left even in an area where a conductive pattern is not formed, when the metal colloid is coated to the entire surface in a metal colloid coating process.

Also, the base material, namely, the lyophilic area in this embodiment preferably has a contact angle to the metal colloid of 40° or less, more preferably 30° or less, and particularly preferably 20° or less. This reason is that in a case where the contact angle to the metal colloid is high in an energy irradiated part, namely the lyophilic area, there is the possibility of the metal colloid being repelled even in the lyophilic area when coating the metal colloid to the entire surface, and there is the possibility of being difficult to pattern the lyophilic area with the metal colloid. Here, the contact angle to a liquid is a value measured by the method explained in the first embodiment.

Specific examples of a layer which may be used as the decomposition removal layer in this embodiment may include those made of fluorine type or hydrocarbon type resins having liquid repellency. There is no particular limitation to these fluorine type or hydrocarbon type resins as long as they have liquid repellency. The decomposition removal layer may be formed by dissolving these resins in a solvent and film forming by a usual method such as a spin coating method.

Also, in this embodiment, a layer free from any defect can be formed by using a functional thin film, that is, a self-assembled monolayer, Langmuir Blodgett film, or layer-by-layer self-assembled film, therefore, it is preferable to use these film forming methods.

Here, a self-assembled monolayer, Langmuir Blodgett film, and layer-by-layer self-assembled film used in this embodiment will be explained in detail.

(i) Self-Assembled Monolayer

The present inventors have no idea of existence of a formal definition of a self-assembled monolayer. However, as an explanatory text for those recognized generally as a self-assembled monolayer, for example, General Remarks by Abraham Ulman, "Formation and Structure of Self-Assembled Monolayers", Chemical Review, 96, 1533-1554 (1996) is excellent. By referring to this General Remarks, the self-assembled monolayer may be said to be a monolayer produced as a result of the adsorption and bonding (self-assembled) of an appropriate molecule to an appropriate base material. Examples of materials having the ability of forming a self-assembled layer include surfactant molecules such as fatty acids, organic silicon molecules such as alkyltrichlorosilanes and alkylalkoxides, organic sulfur molecules such as alkanethiols, and organic phosphoric acid molecules such as alkyl phosphates. The general point in common of the molecular structure is that they have relatively long alkyl chains and functional groups interacting with the surface of a base material are existing at one molecular terminal. The part of the alkyl chain is a source of intermolecular force when molecules are packed two-dimensionally to each other. Of course, the example shown here is the simplest structure, and self-assembled monolayers comprising various molecules such as those having an amino group or a carboxyl group at the other terminal of the molecule, those in which the part of alkylene chain is an oxyethylene chain, fluorocarbon chain, or chain of the combined type of these chains are reported. Also, there are complex type self-assembled monolayers comprising plural sorts of molecules. Also, in recent years, there is the case where monolayers in which a layer of polymer, such as particle polymers having plural functional groups (one functional group in some cases) those represented by a dendrimer, or straight-chain polymer (with branching structure in some cases), is formed on a base material surface is considered to be self-assembled monolayers (the latter is generically called a polymer brush). In this embodiment, these are included in the self-assembled monolayers, also.

(ii) Langmuir Blodgett Film

The Langmuir Blodgett film used in this embodiment dose not differ greatly in shape from the aforementioned self-assembled monolayer once it is formed on a base material. It may be said that the Langmuir Blodgett film is characterized by its forming method and highly two-dimensional molecular packing properties (high orientation properties and high orderly properties) due to the forming method. That is, the Langmuir Blodgett film forming molecule is generally developed first on a vapor-liquid interface. The developed film is condensed by a trouph and transformed into a highly packed condensed film. Actually, this condensed film is transferred to a proper base material when used. These measures outlined here make it possible to form films ranging from a monolayer to a multilayer film comprising desired molecular layers. Also, not only low molecules but also high molecules and colloid particles may be used as film materials. Current examples of which various materials are used are described in detail in General Remarks by MIYASHITA Tokuji, "Prospects for Nano-technologies by Creation of Soft type Nano-devices" Polymer, Vol 50, September issue, 644-647 (2001).

(iii) Layer-By-Layer Self-Assembled Film

Layer-by-layer self-assembled film is a layer which is generally formed by adsorbing and binding at least two materials comprising a functional group comprising a positive or negative charge sequentially to a base material to laminate these materials. Ionic polymers (polymer electrolytes) are frequently used as materials in these days because materials having many functional groups have many advantages such that strength and durability of the layer is improved. Also, particles of proteins, metals, oxides or the like having a surface charge, so-called "colloid particles" are also frequently used as film forming materials. Moreover, films utilizing an interaction weaker than ionic bonds such as a hydrogen bonding, coordinate bonding and hydrophobic interaction have also been recently reported. Relatively recent examples of the layer-by-layer self-assembled film are described in detail in General Remarks by Paula T. Hammond, "Recent Explorations in Electrostatic Multilayer Thin Film Assembly" Current Opinion in Colloid & Interface Science, 4, 430-442 (2000) though slightly inclined towards materials using electrostatic interaction as driving force. The Layer-by-layer self-assembled film is a film formed by repeating a cycle of adsorption of a material having a positive (negative) charge —cleaning—adsorption of a material having a negative (positive) charge—cleaning, for predetermined times, if explained by the simplest process as an example. Unlike the Langmuir Blodgett film, the development—condensation—transfer operation is not necessary at all. As is clear from the difference between these methods for manufacturing, the layer-layer-self-assembled film is not generally provided with two-dimensional high orientation properties and high orderly properties like the Langmuir Blodgett film. However, the layer-by-layer self-assembled film and its method for manufacturing have many advantages that are not found in conventional film forming methods in the point that an elaborate film free from defects can be easily formed, and the layer-by-layer self-assembled film can be formed evenly on a fine irregular surface, inside surface of a tube, spherical surface and the like.

Also, there is no particular limitation to the layer thickness of the decomposition removal layer as long as it is such a level as to be decomposed and removed by irradiated energy in an energy irradiating process which will be described later. Specifically, the thickness is preferably set in a range generally of 0.001 µm to 1 µm, and particularly from 0.01 µm to 0.1 µm, though it differs greatly depending on the type of energy to be irradiated and the material used for the decomposition removal layer.

(2) Decomposition Removal Pattern Forming Process

Next, a decomposition removal pattern forming process in this embodiment will be explained. The decomposition removal pattern forming process in this embodiment is a process of forming a pattern, of which the decomposition removal layer is decomposed and removed, on the surface of the decomposition removal layer by irradiating the decomposition removal layer in pattern with energy from a predetermined direction. The type of energy, the method of irradiating energy and the like in this decomposition removal pattern forming process are the same as those in the wettability pattern forming process described in the first embodiment, therefore, explanations are omitted here.

(3) A Metal Colloid Coating Process.

Next, a metal colloid coating process will be explained. A metal colloid coating process in this embodiment is a process of adhering a metal colloid to the decomposition removal pattern formed in the above mentioned decomposition removal pattern forming process.

The metal colloid and the coating method in the metal colloid coating process in this embodiment are the same as those in the a metal colloid coating process in the first embodiment, therefore, explanations are omitted here.

When the difference between the contact angle of the decomposition removal layer to the metal colloid and the contact angle of the photocatalyst treatment layer to the metal colloid is small, the metal colloid coating process is preferably carried out by a method of coating the metal colloid in a pattern such as a nozzle discharging method.

(4) Conductive Pattern Forming Process

Next, the conductive pattern forming process is carried out wherein the metal colloid adhered in a pattern in the above a metal colloid coating process is solidified. The method of solidifying the metal colloid in this conductive pattern forming process and the like are the same as those in the conductive pattern forming process in the first embodiment, therefore, explanations are omitted here.

(5) Non-Drawn Part Removing Process

In this embodiment, the non-drawn part removing process, wherein a non-conductive pattern part where no conductive pattern has been formed is removed, may be comprised after the conductive pattern forming process. When the decomposition removal layer is conductive, it is difficult to make a conductive pattern forming body even if a conductive pattern is provided. Therefore, the photocatalyst treatment layer is bared by removing the remaining decomposition removal layer to form a conductive pattern forming body. Also, the non-drawn part removing process in this embodiment may be a process of removing the decomposition removal layer and the photocatalyst treatment layer when the decomposition removal layer and the photocatalyst treatment layer are made of conductive materials.

The non-drawn part removing process in this embodiment is also the same as the non-drawn part removing process in the aforementioned first embodiment, therefore, explanations are omitted here.

(6) Others

In this embodiment, the conductive pattern forming body may be further subjected to electroplating to increase the layer thickness of the conductive pattern. By doing so, the resistance of the conductive pattern can be reduces, and at the same time, the strength of adhesion of the conductive pattern to the photocatalyst treatment layer can be improved, leading to the formation of a high quality and highly precise wiring board.

Also, in this embodiment, a protective layer may be formed on the resulting conductive pattern from the viewpoint of, for example, improving the adhesion of the resulting conductive pattern to the photocatalyst treatment layer.

4. Fourth Embodiment

Next, a fourth embodiment of the method for manufacturing a conductive pattern forming body according to the present invention will be explained.

The method for manufacturing a conductive pattern forming body in the fourth embodiment comprises:

a property variable pattern forming process of placing a photocatalyst treatment layer side substrate comprising a base member and a photocatalyst treatment layer containing a photocatalyst, and a pattern forming body substrate comprising a property variable layer whose property is changed by an action of a photocatalyst in the photocatalyst treatment layer so that the photocatalyst treatment layer and the property variable layer are placed with a gap of 200 µm or less, and then, irradiating with energy from predetermined direction to form a property variable pattern, whose property is changed, on a surface of the property variable layer;

a metal colloid coating process of adhering a metal colloid in a pattern to the surface of the pattern forming body substrate on which the property variable pattern is formed by coating the metal colloid; and a conductive pattern forming process of forming conductive pattern by solidifying the metal colloid adhered in a pattern to the property variable pattern.

The aforementioned photocatalyst treatment layer side substrate preparing process and the aforementioned pattern forming body substrate preparing process may be comprised in the method for manufacturing a conductive pattern forming body in this embodiment. However, the above processes are not necessarily comprised if the similar ones, as the photocatalyst treatment layer side substrate formed in the below mentioned photocatalyst treatment layer side substrate preparing process and the pattern forming body substrate formed in the pattern forming body substrate preparing process, are used.

In the method for manufacturing a conductive pattern forming body in this embodiment, the photocatalyst treatment layer and the property variable layer are placed at predetermined positions, and then, irradiated with energy from a predetermined direction to form a property variable pattern in which the property of the energy irradiated part is changed by an action of the photocatalyst contained in the photocatalyst treatment layer. Because after treatments such as development and cleaning after energy irradiation is not necessary in the formation of the pattern, patterns differing in properties can be formed by fewer processes than before at a low cost. And, a metal colloid is coated to the property variable pattern on the property variable layer, whereby the metal colloid can be adhered in a pattern and a conductive pattern can be formed easily by solidifying this metal colloid.

Moreover, in this embodiment, the properties of the property variable layer are changed by an action of the photocatalyst contained in the photocatalyst treatment layer and then, the photocatalyst treatment layer side substrate is dismounted to form the pattern forming body substrate into a conductive pattern forming body. Therefore, the photocatalyst is not necessarily contained in the resulting conductive pattern forming body. Therefore, it is possible to prevent such a disorder that the resulting conductive pattern forming body is affected with time by an action of the photocatalyst.

The method for manufacturing a conductive pattern forming body in this embodiment as aforementioned will be explained in detail with reference to the drawings. FIG. 5a to 5e are views showing one example of the method for manufacturing a conductive pattern forming body in this embodiment.

Figure 5A:
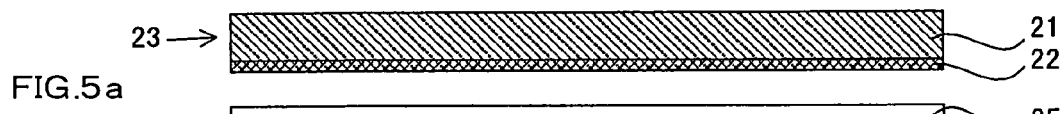
FIG. 5a to 5e are process diagrams showing another example of a method for manufacturing a conductive pattern forming body according to the present invention.

In this example, first, a photocatalyst treatment layer side substrate 23 obtained by forming a photocatalyst treatment layer 22 on a base material 21 and a pattern forming body substrate 26 obtained by forming a property variable layer 25 on a base material 24 are prepared (see FIG. 5a, a photocatalyst treatment layer side substrate preparing process and a pattern forming body substrate preparing process).

Figure 5B:
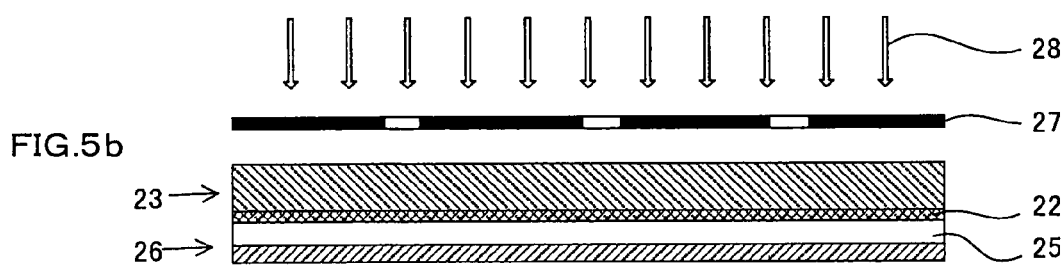
Figure 5C:
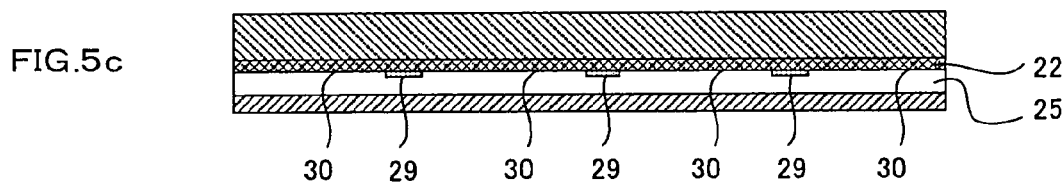

Next, as shown in FIG. 5b, the photocatalyst treatment layer side substrate 23 and the pattern forming body substrate 26 are irradiated with an ultraviolet light 28 via a photomask 27, on which a necessary property variable pattern is drawn, from the photocatalyst treatment layer side substrate 23 side, after the photocatalyst treatment layer 22 and the property variable layer 25 are each placed at predetermined positions. As shown in FIG. 5c, by this, a property variable pattern comprising a property variable area 29 and an on-property variable area 30 is formed on the surface of the property variable layer 25 (a property variable pattern forming process).

In this case, the photocatalyst treatment layer 22 and the property variable layer 25 are placed so as to be in perfectly close contact with each other in FIG. 5. In this embodiment, however, in addition to the case where the both layers are in contact with each other in a physically closely contacted state, the photocatalyst treatment layer 22 and the property variable layer 25 may be placed with a clearance which is a gap to an extent that the photocatalyst in the photocatalyst treatment layer 22 is actable.

Although the above irradiation with ultraviolet rays is carried out via the photomask 27 in the above example, a structure in which the photocatalyst treatment layer is formed in a pattern, or a structure in which a light shielding part (photocatalyst treatment layer side light shielding part) is formed in the photocatalyst treatment layer side substrate, as mentioned below, may also be used. In this case, energy is irradiated to the entire surface without using the photomask 27 or the like.

And a process of dismounting the photocatalyst treatment layer side substrate from the pattern forming body substrate 26 is carried out (FIG. 5d), whereby a pattern forming body substrate 26 of which the property variable area 29 and the non-property variable area 30 are formed on the surface can be obtained.

Then, a metal colloid is coated to the pattern forming body substrate 26 to adhere the metal colloid only to the property variable area (metal colloid coating process). Then, the metal colloid is cured and a conductive pattern forming body 32 in which a conductive pattern 31 is formed on the property variable layer 25 can be obtained.

Such method for manufacturing a conductive pattern forming body in this embodiment will be explained by each process in detail.

(1) Photocatalyst Treatment Layer Side Substrate Preparing Process

The photocatalyst treatment layer side substrate preparing process in this embodiment is a process of preparing the photocatalyst treatment layer containing a photocatalyst and the photocatalyst treatment layer side substrate having a base member.

The photocatalyst treatment layer side substrate manufactured in this process is provided with at least the photocatalyst treatment layer and the base member as aforementioned, and is usually formed of a thin layer of photocatalyst treatment layer formed on a base member by predetermined method. Also, as the photocatalyst treatment layer side substrate, one provided with a photocatalyst treatment layer side light shielding part formed in a pattern or a primer layer may be used.

(Photocatalyst Treatment Layer)

The photocatalyst treatment layer used in this embodiment is not particularly limited as long as it has a structure of which the photocatalyst in the photocatalyst treatment layer changes the properties of the property variable layer. The photocatalyst treatment layer may be constituted of a photocatalyst and a binder, or may be formed as a film by a photocatalyst alone. Also, the properties of the surface may be lyophilic or liquid repellent.

Figure 6:
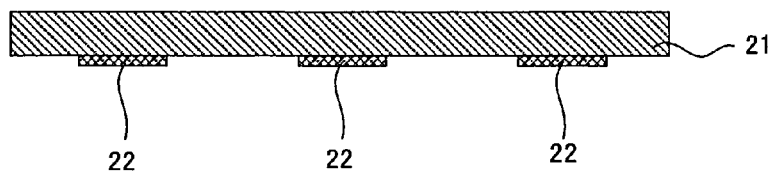
FIG. 6 is a schematic sectional view showing one example of a photocatalyst treatment layer side substrate used in the present invention.

Although the photocatalyst treatment layer used in this embodiment may be formed on the entire surface of a base member 21 as shown in FIG. 5a and the like, or the photocatalyst treatment layer 22 may be formed in a pattern on the base member 21 as shown in FIG. 6.

As explained later the property variable pattern forming process, by accordingly forming the photocatalyst treatment layer in a pattern, pattern irradiation using a photomask of the photocatalyst treatment layer is not necessary when the property variable layer is irradiated with energy. Also, a property variable pattern comprising a property variable area and a non-property variable area can be formed on the property variable layer by irradiating the entire surface.

Although there is no particular limitation to a method of patterning the photocatalyst treatment layer, the patterning may be carried out by a photolithography method or the like.

The photocatalyst treatment layer has the advantage that when the photocatalyst treatment layer is brought into close contact with or faced to the property variable layer for energy irradiation, the properties of only the part where the photocatalyst treatment layer is actually formed is changed, therefore, the energy may be irradiated from any direction as long as the energy is irradiated to the part where the photocatalyst treatment layer is brought into close contact with or faced to the property variable layer. And also, the energy to be irradiated is not particularly limited to a parallel one such as parallel light.

As the photocatalyst treatment layer used in this embodiment, the same photocatalyst treatment layer as used in the second embodiment may be used, therefore, detailed explanations are omitted here.

(Base Member)

In this embodiment, as shown in FIG. 5, the photocatalyst treatment layer side substrate 23 is provided with at least the base member 21 and the photocatalyst treatment layer 22 formed on the base member 21.

In this case, the material constituting the base material to be used is selected properly according to, for example, the direction of energy irradiation in the below mentioned property variable pattern forming process and depending on whether or not a resulting conductive pattern forming body requires transparency.

That is, when the conductive pattern forming body uses an opaque material such as a paper base phenol resin laminate as the base material, energy is inevitably irradiated from the direction of the photocatalyst treatment layer side substrate side. As shown in FIG. 5b, it is necessary that a photomask 27 is placed on the photocatalyst treatment layer side substrate 23 side energy irradiation. Also, when a photocatalyst treatment layer side light shielding part is formed in a predetermined pattern in advance on the photocatalyst treatment layer side substrate to form a property variable pattern by using the photocatalyst treatment layer side light shielding part as will be described later, energy must be irradiated from the photocatalyst treatment layer side substrate side. In such a case, the base member must have transparency.

In the meantime, when the conductive pattern forming body is, for example, a transparent resin film, a photomask may be placed on the pattern forming body substrate side for energy irradiation. Also, as will be described later, when a pattern forming body side light shielding part is formed in this pattern forming body substrate, energy must be irradiated from the pattern forming body substrate side. In such a case, the transparency of the base member is not particularly required.

Also, the base member to be used in this embodiment may be those having flexibility, for example, a resin film, or may be those having no flexibility, for example, a glass substrate. This is properly selected according to the method of energy irradiation in the below mentioned property variable pattern forming process.

As mentioned above, although the material of the base member used for the photocatalyst treatment layer side substrate in this embodiment is not particularly limited, a material which has a predetermined strength and the surface of which is highly adhesive to the photocatalyst treatment layer is preferably used because the photocatalyst treatment layer side substrate in this embodiment is used repeatedly.

Specific examples of such a material may include glass, ceramics, metals and plastics.

An anchor layer may be formed on the base member to improve the adhesion between the surface of the base member and the photocatalyst treatment layer. Examples of materials used for the anchor layer may include silane type and titan type coupling agents.

(Photocatalyst Treatment Layer Side Light Shielding Part)

As the photocatalyst treatment layer side substrate used in this embodiment, a substrate provided with a photocatalyst treatment layer side light shielding part formed in a pattern may be used. When the photocatalyst treatment layer side substrate provided with such a photocatalyst treatment layer side light shielding part is used, it is not necessary to use a photomask when the substrate is irradiated with energy and it is also not necessary to carry out laser beam drawing irradiation. Therefore, because the alignment of the photocatalyst treatment layer side substrate with a photomask is not necessary, the process can be simple. Also, because a costly device required for drawing irradiation is not necessary, there is a merit that it is advantageous in light of cost.

There are two configurations of the photocatalyst treatment layer side substrate provided with such a photocatalyst treatment layer side light shielding part, according to the position where the photocatalyst treatment layer side light shielding part is formed.

Figure 7:
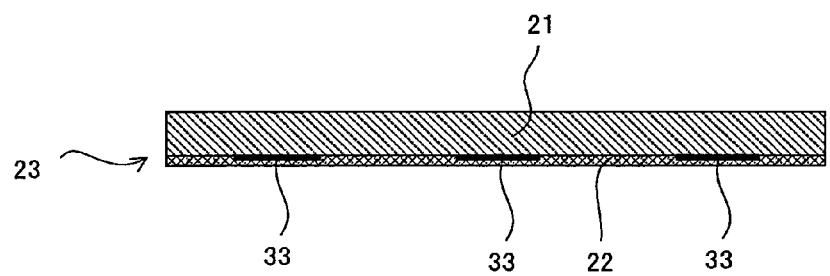
FIG. 7 is a schematic sectional view showing another example of a photocatalyst treatment layer side substrate used in the present invention.
Figure 8:
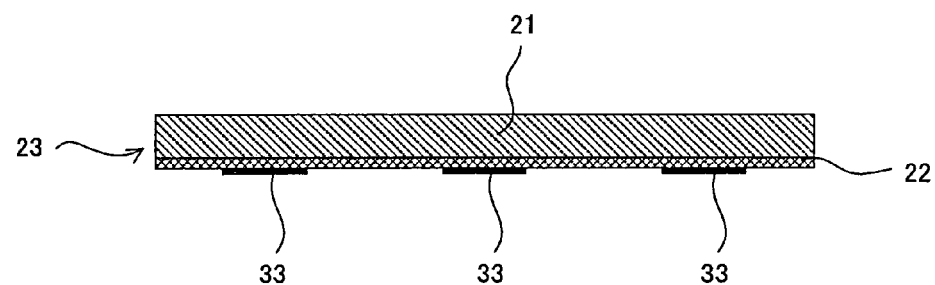
FIG. 8 is a schematic sectional view showing another example of a photocatalyst treatment layer side substrate used in the present invention.

In one configuration, as shown in FIG. 7, a photocatalyst treatment layer side light shielding part 33 is formed on a base member 21, and a photocatalyst treatment layer 22 is formed on the photocatalyst treatment layer side light shielding part 33 to form a photocatalyst treatment layer side substrate 23. In another configuration, as shown in FIG. 8, a photocatalyst treatment layer 22 is formed on a base member 21, and a photocatalyst treatment layer side light shielding part 33 is formed thereon to form a photocatalyst treatment layer side substrate 23.

In either configuration, because the photocatalyst treatment layer side light shielding part is placed near the part where the photocatalyst treatment layer and the property variable layer are contacted or faced to each other, the influence of the scattering energy in the base member and the like can be reduced as compared with the case of using a photomask, therefore, pattern irradiation of energy can be carried out with outstandingly high precision.

Also, in the configuration in which the photocatalyst treatment layer side light shielding part is formed on the photocatalyst treatment layer, this has the advantage that when the photocatalyst treatment layer and the property variable layer are placed at predetermined positions, in a case where it is preferable to place the both with a predetermined gap as will be described later, the photocatalyst treatment layer side light shielding part may be used as a spacer making the above gap even by making the layer thickness of the photocatalyst treatment layer side light shielding part coinciding to the width of the gap.

That is, when the photocatalyst treatment layer and the property variable layer are placed in the condition that the both are in contact with or facing to each other with a predetermined gap, by placing the photocatalyst treatment layer side light shielding part and the property variable layer in a closely contact state, the above mentioned predetermined gap can be made precisely, and by irradiating energy from the photocatalyst treatment layer side substrate in this condition, a property variable pattern can be formed on the property variable layer with high accuracy.

Methods for forming such a photocatalyst treatment layer side light shielding part is not particularly limited, and an appropriate method is selected and used according to the properties of the surface on which the photocatalyst treatment layer side light shielding part is formed or to the necessary shielding properties from energy.

For example, a thin film of a metal such as chromium may be formed in a thickness of about 1000 to 2000 Å by using a sputtering method or vacuum deposition method and then by patterning to form the light shielding part. As this patterning method, usual patterning methods such as sputtering may be used.

Also, a method may be adopted in which a layer containing light shielding particles such as a carbon fine particle, metal oxide, inorganic pigment, and organic pigment, in a resin binder is formed in a pattern. As the resin binder to be used, one kind or a mixture of two or more kinds of resins such as a polyimide resin, acryl resin, epoxy resin, polyacrylamide, polyvinyl alcohol, gelatin, casein and cellulose, or photosensitive resins, or further, O/W emulsion type resin compositions, for example, emulsified reactive silicone may be used. The thickness of such resin light shielding part may be set in a range of 0.5 to 10 μm. As a method of patterning such a resin light shielding part, usually used methods such as a photolithographic method and printing method may be used.

As the position where the photocatalyst treatment layer side light shielding part is formed in the above explanations, two cases, namely the case where it is placed in between the base member and the photocatalyst treatment layer, and the case where it is placed on the surface of the photocatalyst treatment layer are explained. However, besides the above configurations, it is possible to adopt a configuration in which the photocatalyst treatment layer side light shielding part is formed on the surface of the base member on the side on which the photocatalyst treatment layer is not formed. In this configuration, for example, there is a case where a photomask is brought into close contact with the surface to the extent that the photomask is removable, and this configuration may be preferably used in a case of changing the property variable pattern in a small lot.

(Primer Layer)

Next, the primer layer used for the photocatalyst treatment layer side substrate in this embodiment will be explained. In this embodiment, the primer layer may be formed in between the photocatalyst treatment layer side light shielding part and the photocatalyst treatment layer, when the photocatalyst treatment layer side light shielding part is formed in a pattern on the base member and the photocatalyst treatment layer is formed thereon to form the photocatalyst treatment layer side substrate.

Although the action and function of the primer layer are not necessarily clear, it is considered, by forming the primer layer in between the photocatalyst treatment layer side light shielding part and the photocatalyst treatment layer, the primer layer exhibits the function of preventing the diffusion of impurities deriving from the photocatalyst treatment layer side light shielding part and an opening existing in between the photocatalyst treatment layer side light shielding parts, particularly impurities such as residues, metals and metal ions, which occur when the photocatalyst treatment layer side light shielding part is patterned, which cause the inhibition of a property change of the property variable layer by an action of the photocatalyst. Therefore, by forming the primer layer, a property changing treatment will proceed in high sensitivity, as a result, a pattern with high resolution can be obtained.

As the primer layer in this embodiment prevents the action of the photocatalyst from being affected by the impurities deriving from not only the photocatalyst treatment layer side light shielding part but also an opening existing in between the photocatalyst treatment layer side light shielding parts, the primer layer is preferably formed on the entire surface of the photocatalyst treatment layer side light shielding part including the opening.

Figure 9:
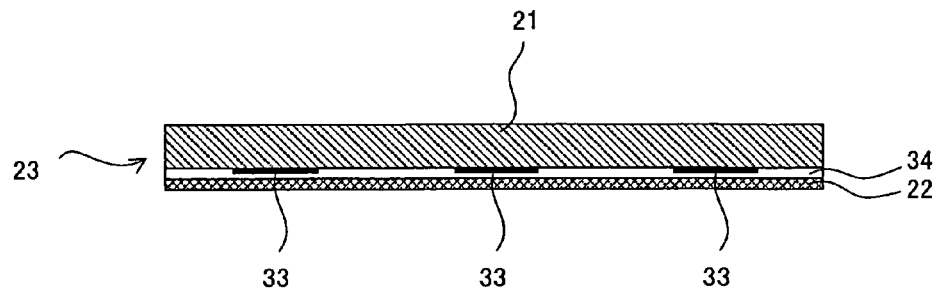
FIG. 9 is a schematic sectional view showing another example of a photocatalyst treatment layer side substrate used in the present invention.

FIG. 9 is a view showing one example of the photocatalyst treatment layer side substrate formed with such a primer layer. A primer layer 34 is formed on a base member 21, on which a photocatalyst treatment layer side light shielding part 33 of the photocatalyst treatment layer side substrate 23 is formed, on the surface of the side on which the photocatalyst treatment layer side light shielding part 33 is formed. A photocatalyst treatment layer 22 is formed on the surface of the primer layer 34.

The primer layer in this embodiment is not particularly limited as long as the photocatalyst treatment layer side substrate has a structure in which the primer layer is formed such that the photocatalyst treatment layer side light shielding part is not in contact with the photocatalyst treatment layer.

The material constituting the primer layer is preferably, though not particularly limited to, inorganic materials which are scarcely decomposed by an action of the photocatalyst. Specifically, amorphous silica can be listed. When such amorphous silica is used, the precursor of this amorphous silica is silicon compounds represented by the formula $SiX_4$ wherein X represents a halogen, a methoxy group, an ethoxy group, or an acetyl group, silanols which are hydrolysates of these, or polysiloxanes having an average molecular weight of 3000 or less are preferable.

Also, the layer thickness of the primer layer is preferably in a range of 0.001 μm to 1 μm, and particularly preferably in a range of 0.001 μm to 0.1 μm.

(2) Pattern Forming Body Substrate Preparing Process

Next, in this embodiment, a pattern forming body substrate preparing process is carried out, wherein a pattern forming body substrate having a property variable layer whose property of the surface is changed by an action of the photocatalyst in the aforementioned photocatalyst treatment layer is prepared. The pattern forming body substrate prepared in this process is not particularly limited as long as it is provided with at least a property variable layer whose property of the surface is changed by an action of the photocatalyst in the above photocatalyst treatment layer. When the property variable layer has a self-supporting ability, it may be made only of the property variable layer, whereas when the property variable layer has not self-supporting ability, the property variable layer may be formed on a base material. Also, the pattern forming body substrate may be provided with a light shielding part and the like therein. Each structure of the pattern forming body substrate forming process will be hereinafter explained.

(Property Variable Layer)

First, the property variable layer used for the pattern forming body substrate in this embodiment will be explained. As the property variable layer used for the pattern forming body substrate in this embodiment is not particularly limited as long as the properties of its surface are changed by an action of the photocatalyst contained in the aforementioned photocatalyst treatment layer. However, in this embodiment, particularly two cases, namely the case where the property variable layer is a wettability variable layer wherein the wettability is changed by an action of the photocatalyst to form a wettability pattern, and the case where the property variable layer is a decomposition removal layer which is decomposed and removed by an action of the photocatalyst to form a pattern of irregularity, are preferable because the effectiveness of this embodiment is more drawn out in relation to, particularly, the resulting property variable pattern and the like.

These wettability variable layer and decomposition removal layer will be hereinafter explained.

a. Wettability Variable Layer

Any layer whose wettability of the surface is changed by an action of the photocatalyst may be used as the wettability variable layer in this embodiment without any particular limitation. However, the wettability variable layer is usually preferably a layer whose wettability is changed so as a contact angle of the surface of the wettability variable layer to a liquid is reduced by an action of the photocatalyst by energy irradiation.

This is because by accordingly forming the wettability variable layer whose wettability is changed so as a contact angle to a liquid is reduced by energy irradiation, the wettability can be changed into a pattern with ease and a pattern of a lyophilic area having a small contact angle to a liquid can be formed by irradiating with energy, for example, in a case of using a photomask, in a case of using the photocatalyst treatment layer side light shielding part, and in a case of forming the photocatalyst treatment layer in a pattern as aforementioned. Therefore, the conductive pattern forming body can be manufactured efficiently, which is economically advantageous.

Here, the lyophilic area means an area having a small contact angle to a liquid and high wettability to the below mentioned metal colloid. On the other hand, the liquid repellent area means an area having a large contact angle to a liquid and low wettability to the metal colloid.

The contact angle of the wettability variable layer to the metal colloid is preferably 50° or more, more preferably 60° or more, and particularly preferably 70° or more, in a part where energy is not irradiated, namely the liquid repellent area. This reason is that since the part where energy is not irradiated is a part for which liquid repellency is required in this embodiment, the liquid repellency is not sufficient when the contact angle to a liquid is small, and in a case of coating the metal colloid on the entire surface in the below mentioned metal colloid coating process, the possibility of the metal colloid being left also in an area where no conductive pattern is formed, which is undesirable.

Also, the contact angle of the wettability variable layer to a metal colloid is preferably 40° or less, more preferably 30° or less, and particularly preferably 20° or less, in a part where energy is irradiated, namely the lyophilic area. This reason is that in a case where the contact angle to the metal colloid is high in a part where energy is irradiated, namely the lyophilic area, there is the possibility of the metal colloid being repelled even in the lyophilic area when coating the metal colloid as will be described later, and there is the possibility of being difficult to pattern the lyophilic area with the metal colloid.

The contact angle to a liquid meant here was obtained in the following manner: the contact angles of the subject material to liquids having different surface tensions were measured (measured 30 seconds after liquid droplets are dripped from a micro-syringe) using a contact angle measuring device (CA-Z model, manufactured by Kyowa Interface Science Co., LTD.) to obtain the contact angle from the results of measurement or by making a graph based on these results. In this measurement, as the liquids having different surface tensions, wetting index standard solutions manufactured by JUNSEI CHEMICAL CO., LTD.) were used.

Here, as the wettability variable layer used in this embodiment, the same wettability variable layer that is explained in the second embodiment may be used, therefore, explanations are omitted here.

Also, the wettability variable layer used in this embodiment may be formed of a material having either self-supporting ability or no self-supporting ability, if it is formed of a material whose wettability of the surface can be changed by an action of the photocatalyst. In this embodiment, "having self-supporting ability" means that it can exist in a concrete state without any supporting material.

When the wettability variable layer is made of a material having self-supporting ability, commercially available resin films made of, for example, materials which can be made into the wettability variable layer, may be used and this is advantageous in light of cost. As such a material, the aforementioned materials formed into a film may be used if they have self-supporting ability. Examples of such a material may include a polyethylene, polycarbonate, polypropylene, polystyrene, polyester, polyvinyl fluoride, acetal resin, nylon, ABS, PTFE, methacryl resin, phenol resin, polyvinylidene fluoride, polyoxymethylene, polyvinyl alcohol, polyvinyl chloride, polyethylene terephthalate, and silicone.

In this embodiment, the wettability variable layer preferably has no self-supporting ability. This is because the wettability variable layers formed of the above mentioned material whose property is largely changed are usually a material not having self-supporting ability, and therefore, by forming on a base material, strength and the like are increased and can be used for various pattern forming bodies.

Though the wettability variable layer used in this embodiment is not particularly limited as long as it is a layer whose wettability is changed by an action of the photocatalyst as aforementioned, a layer containing no photocatalyst is particularly preferable. This is because if no catalyst is contained in the wettability variable layer, there is no need to worry about the influence of the photocatalyst with time, and it is therefore, possible to use it without any problem for a long period of time when it is used as a functional element.

In this embodiment, the thickness of the wettability variable layer is preferably in a range of 0.001 μm to 1 μm, and particularly preferably in a range of 0.01 to 0.1 μm, in relation to the rate of change in wettability caused by the photocatalyst.

In this embodiment, by the use of the wettability variable layer having the aforementioned components, the wettability of an energy irradiated part is changed to be a lyophilic area by utilizing the effects of oxidation and decomposition, by an action of the photocatalyst contained in the photocatalyst treatment layer which is in contact with or facing to, of organic groups which are a part of the above components, making it possible to produce a large difference in wettability from the non-energy irradiated part. As a consequence, it is possible to adhere the metal colloid only to the lyophilic area which is the part irradiated with energy with ease, also in a case of coating the metal colloid to the entire surface as will be described later, and a highly precise conductive pattern forming body can be manufactured at a low cost.

b. Decomposition Removal Layer

Next, the decomposition removal layer will be explained. There is no particular limitation to the decomposition removal layer used in this embodiment as long as a part of the decomposition removal layer which is irradiated with energy is decomposed and removed by an action of the photocatalyst contained in the photocatalyst treatment layer when irradiated with energy.

As aforementioned, since a part of the decomposition removal layer which is irradiated with energy is decomposed and removed by an action of the photocatalyst, it is possible to form a pattern comprising a part where the decomposition removal layer is present and a part where the decomposition removal layer is not present, that is, a pattern having irregularity, without carrying out a developing process or a cleaning process.

Although this decomposition removal layer is removed without carrying out any particular after treatment such as a developing process and cleaning process because it is, for example, oxidation decomposed and vaporized by an action of the photocatalyst by energy irradiation, a cleaning process and the like may be carried out depending on the material of the decomposition removal layer.

Also, the decomposition removal layer used in this embodiment is preferably not only provided with irregularities, but also has a higher contact angle to a liquid than the base material which will be described later. This is because the decomposition removal layer is thereby decomposed and removed, and an area where the base material is bared can be a lyophillic area and an area where the decomposition removal layer remains can be a liquid repellent area, enabling the formation of various patterns.

Here, the lyophilic area means an area having a small contact angle to a liquid and high wettability to the metal colloid which will be described later. On the other hand, the liquid repellent area means an area having a large contact angle to a liquid and low wettability to the metal colloid.

Also, the decomposition removal layer preferably has a contact angle to the metal colloid of 50° or more, more preferably 60° or more, and particularly preferably 70° or more. This is because, in the is embodiment, the remaining decomposition removal layer is the part of which liquid repellency is required, liquid repellency is not sufficient when the contact angle to a liquid is small, when the metal colloid is coated to the entire surface in the below mentioned metal colloid coating process, there is the possibility of the metal colloid being left even in an area where a conductive pattern is not formed, which is not preferable.

Also in this embodiment, a contact angle of the below mentioned base material to the metal colloid is preferably 40° or less, more preferably 30° or less, and particularly preferably 20° or less. This reason is that since the base material is a part of which lyophilic properties are required in this embodiment, there is a possibility of the metal colloid being repelled even in the lyophilic area when coating the metal colloid as will be described later, and there is a possibility of being difficult to pattern the lyophilic area with the metal colloid. Here, the contact angle to a liquid is a value measured using the method explained above.

In this case, the base material which will be explained later may be surface-treated to make its surface lyophilic. Examples of the surface treatment performed such that the surface of a material is made to be lyophilic include lyophilic surface treatment by means of plasma treatment utilizing argon, water or the like. Examples of the lyophilic layer formed on the base material may include a silica film obtained by a sol gel method using tetraethoxysilane.

Here, the decomposition removal layer used in this embodiment is the same as the decomposition removal layer explained in the aforementioned third embodiment, therefore, explanations are omitted here.

(Base Material)

Next, the base material will be explained. In this embodiment, the base material is used, for example, when the aforementioned property variable layer has no self-supporting ability or when the property variable layer is a decomposition removal layer. For instance, as shown in FIG. 5a, a property variable layer 25 is provided on a base material 24.

Such a base material is properly selected according to, for example, the use purpose of the finally obtained conductive pattern forming body. For example, in a case of usual print boards and the like, materials used generally, specifically, resin laminates of paper base bodies, resin laminates of glass cloth or non-woven glass fabric base bodies, ceramics, and metals may be used. Also, in flexible print boards, flexible resin films may be used as the base material.

(Others)

In this embodiment, one obtained by forming a pattern forming body substrate side light shielding part in a pattern on a pattern forming body substrate may be used.

In this case, because energy must be irradiated from the pattern forming body substrate side in the below mentioned property variable pattern forming process, the aforementioned property variable layer and the base material are preferably formed of transparent materials.

Also, in a case where the property variable layer is formed on the base material, it is preferable that the pattern forming body substrate side light shielding part is formed in a pattern on the surface of the base material and the property variable layer is formed thereon. In a case where the property variable layer has self-supporting ability and is not formed on the base material, the pattern forming body substrate side light shielding part is preferably formed on the surface of the property variable layer on the side on which the property variable pattern is not formed.

A method of forming such a light shielding part is the same as in a case of the aforementioned photocatalyst treatment layer side light shielding part, therefore, explanations are omitted here.

(3) Property Variable Pattern Forming Process

In this embodiment, a property variable pattern forming process is carried out next, wherein the photocatalyst treatment layer and the property variable layer are placed at predetermined positions, and then, energy is irradiated from a predetermined direction to form a pattern on the surface of the property variable layer. Each structure of the property variable pattern forming process will be hereinafter explained.

(Arrangement of the Photocatalyst Treatment Layer and the Property Variable Layer)

In this process, first, when irradiating energy, it is necessary that the photocatalyst treatment layer and the property variable layer are placed such that they are in contact with each other or with a predetermined clearance from each other as to allow the action of the photocatalyst to exert.

Here, the term "contact" in this embodiment means the condition that is placed such that the action of the photocatalyst is substantially exerted on the surface of the property variable layer, and is a concept including the condition that the photocatalyst treatment layer and the property variable layer are placed with a predetermined clearance, besides the condition that the both are physically in contact with each other. This gap is preferably 200 μm or less.

The above gap in this embodiment is particularly in a range of 0.2 μm to 10 μm, and preferably in a range of 1 μm to 5 μm, taking it into account that extremely high precision pattern is obtained, the sensitivity of the photocatalyst is high, and therefore the efficiency of property change of the property variable layer is improved. Such a range of the gap is particularly effective for a small area conductive pattern forming body in which the gap can be controlled with high precision.

On the other hand, in a case of carrying out treatment for a conductive pattern forming body having an area as large as 300 mm×300 mm or more, it is very difficult to form a fine gap as aforementioned in between the photocatalyst treatment layer side substrate and the pattern forming body substrate so as not to allow the both to be in contact with each other. For this, when the conductive pattern forming body has a relatively large area, it is preferable that the above gap is preferably in a range of 10 to 100 μm, and particularly in a range of 50 to 75 μm. This is because by setting the gap in such a range, problems of deterioration of pattern accuracy, for example, blurring of a pattern, and the problem that the sensitivity of the photocatalyst is deteriorated so that the efficiency of property variation is reduced, do not arise. And further, there is an effect that an uneven change in the properties of the property variable layer are not caused.

When a conductive pattern forming body having relatively large area is irradiated with energy, it is preferable to set the gap in an aligning device used to align the photocatalyst treatment layer side substrate and the pattern forming body substrate in an energy irradiating apparatus is preferably in a range of 10 μm to 200 μm, and particularly in a range of 25 μm to 75 μm. This reason is that by setting the value in the above range, a large deterioration in pattern accuracy and a large deterioration in the sensitivity of the photocatalyst is not caused, and the photocatalyst treatment layer side substrate and the pattern forming body substrate can be arranged without being in contact with each other.

Active oxygen species produced from oxygen and water by an action of the photocatalyst is easily desorbed by placing the photocatalyst treatment layer and the surface of the property variable layer with a predetermined clearance. That is, when the gap between the photocatalyst treatment layer and the property variable layer is narrower than the above range, desorption of the above active oxygen species will become difficult, with the result that there is the possibility that the rate of property change is lowered, which is not desirable. Also, when placed with larger clearance than the above range, the produced oxygen species are scarcely reached to the property variable layer, and also in this case, there is the possibility that the rate of property change is lowered, which is not desirable.

In this embodiment, such a contact or facing condition is to be maintained only at least during energy irradiation.

Examples of a method for placing the photocatalyst treatment layer and the property variable layer with such an extremely narrow gap evenly formed include a method using a spacer. The use of such an spacer ensures that an even gap can be formed and also, a predetermined property variable pattern can be formed on the property variable layer by making this spacer to have the same pattern as the above property pattern, because the action of the photocatalyst does not reach to the surface of the property variable layer in the part with which the spacer is in contact.

In this embodiment, such a spacer may be formed into one member. However, for simplifying the process or the like, it is preferably formed on the surface of the photocatalyst treatment layer of the photocatalyst treatment layer side substrate as explained in the paragraph of the photocatalyst treatment layer side substrate preparing process. In the explanations of the photocatalyst treatment layer side substrate preparing process, the spacer is explained as the photocatalyst treatment layer side light shielding part. However, in this embodiment, it is only required for such a spacer to have the function to protect the surface such that the action of the photocatalyst is not reached on the surface of the property variable layer, and therefore, the spacer may be formed of a material having no ability of shielding irradiated energy, in particular.

(Energy Irradiation to the Contact or Facing Part)

Next, energy is irradiated to the contact or facing part in the condition that the contact or facing condition is maintained as aforementioned. The energy to be irradiated and the like in the energy irradiation in this embodiment are the same as those in the aforementioned first embodiment, therefore, explanations are omitted here.

The direction of energy irradiation in this embodiment is decided based on the method for forming a property variable pattern such as whether the photocatalyst treatment layer side light shielding part or pattern forming body substrate side light shielding part is formed or not, or based on whether the photocatalyst treatment layer side substrate or pattern forming body substrate is transparent or not.

That is, in a case where the photocatalyst treatment layer side light shielding part is formed, energy must be irradiated from the photocatalyst treatment layer side substrate, and also, in this case, the photocatalyst treatment layer side substrate must be transparent to the energy to be irradiated. In this case, also energy may be irradiated either from the photocatalyst treatment layer side substrate side or from the pattern forming body substrate side, in a case where the photocatalyst treatment layer side light shielding part is formed on the photocatalyst treatment layer and this photocatalyst treatment layer side light shielding part is used so as to provide a function as a spacer.

On the other hand, when the pattern forming body substrate side light shielding part is formed, energy must be irradiated from the pattern forming body substrate side, and also in this case, the pattern forming body substrate must be transparent to the energy to be irradiated. In this case, also, energy may be irradiated either from the photocatalyst treatment layer side substrate side or from the pattern forming body substrate side, in a case where the pattern forming body substrate side light shielding part is formed on the property variable layer and this pattern forming body substrate side light shielding part is used so as to provide a function as a spacer.

As the direction of energy irradiation in a case where the photocatalyst treatment layer is formed in a pattern, energy may be irradiated from any direction as long as it is irradiated to the part where the photocatalyst treatment layer and the property variable layer are in contact with or facing to each other.

Similarly, in also the case of using the aforementioned spacer, energy may be irradiated from any direction insofar as energy is irradiated to the contact or facing part.

When a photomask is used, energy is irradiated from the side on which the photomask is placed. In this case, the substrate on the side on which the photomask is placed. In this case the substrate on the side the photomask is placed, namely, either one of the photocatalyst treatment layer side substrate or the pattern forming body substrate must be transparent.

(Dismount of the Photocatalyst Treatment Layer Side Substrate)

Figure 5D:
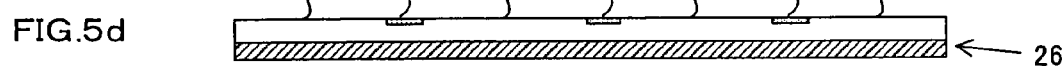
Figure 5E:
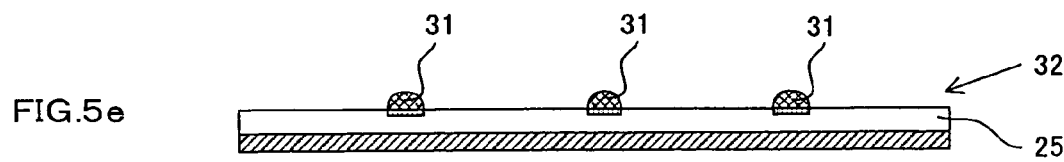

After the energy irradiation as aforementioned is finished, the photocatalyst treatment layer side substrate is separated from the position where it is placed in contact with or with a gap from the property variable layer, to form a property variable pattern comprising a property variable area 29 and a non-property variable area 30 on a property variable layer 25, as shown in FIG. 5d.

(4) Metal Colloid Coating Process.

In this embodiment, next, a metal colloid coating process is carried out, wherein the metal colloid is coated to the surface of the pattern forming body substrate on which the aforementioned property variable pattern is formed, to adhere the metal colloid in a pattern.

The metal colloid and the coating method in the metal colloid coating process in this embodiment are the same as those in the metal colloid coating process in the first embodiment, therefore, explanations are omitted here.

(5) Conductive Pattern Forming Process

In this embodiment, finally a conductive pattern forming process is carried out wherein the metal colloid adhered in a pattern is solidified to form a conductive pattern. Thus, the pattern forming body substrate is finally formed into the conductive pattern forming body.

The method of solidifying the metal colloid in this conductive pattern forming process and the like are the same as those in the conductive pattern forming process in the first embodiment, therefore, explanations are omitted here.

(6) Non-Drawn Part Removing Process

The method for manufacturing a conductive pattern forming body in this embodiment may comprise, besides the above processes, a non-drawn part removing process wherein the property variable layer is removed, except for the part where the conductive pattern has been formed in the aforementioned conductive pattern forming process. When the property variable layer is conductive, it is difficult to form a conductive pattern forming body even if a conductive pattern is provided on the pattern forming body. Therefore, the base material is bared by removing the property variable layer, in an area except for the conductive pattern, to form a conductive pattern forming body. In this case, the base material must be an insulated material among the aforementioned materials.

The non-drawn part removing process in this embodiment is also the same as the non-drawn part removing process in the aforementioned first embodiment, therefore, explanations are omitted here.

(7) Others

In this embodiment, the conductive pattern forming body may be subjected to electroplating to increase the layer thickness of the conductive pattern. This is because by doing so, the resistance of the conductive pattern can be reduced, and at the same time, the strength of adhesion of the conductive pattern to the property variable layer can be improved, leading to the formation of a high quality and highly precise wiring board.

Also, in this embodiment, an insulating protective layer may be further formed after the above conductive pattern is formed. This is because by doing so, such disorders that the conductive pattern is peeled off can be prevented. Also, when this insulating protective layer is a property variable layer, it can be used as a multilayer print board by further forming a conductive pattern thereon.

B. Pattern Forming Body

Next, the pattern forming body of the present invention will be explained. The pattern forming body of the present invention has nine embodiments. Each pattern forming body will be explained hereinbelow.

1. First Embodiment

First, the first embodiment of the pattern forming body of the present invention will be explained. The first embodiment of the pattern forming body of the present invention comprises: a base material; a photocatalyst containing layer which is a layer formed on the base material whose wettability of an energy irradiated part is changed so as a contact angle to a liquid is reduced, and contains at least a photocatalyst and a binder; and a metal composition formed on the photocatalyst containing layer by solidifying a metal colloid in a pattern.

The conductive pattern forming body in this embodiment is provided with the photocatalyst containing layer, and it is therefore, possible to form a conductive pattern with ease in a small number of processes by utilizing a difference in wettability, and a conductive pattern forming body can be formed at a low cost.

Also, in a case of this embodiment, the electric resistance of the photocatalyst containing layer is preferably in a range of $1\times10^8$ $\Omega$·cm to $1\times10^{18}$ $\Omega$·cm, and particularly preferably in a range of $1\times10^{12}$ $\Omega$·cm to $1\times10^{18}$ $\Omega$·cm, since the conductive pattern is formed on the photocatalyst containing layer, and it is thereby possible to form an excellent conductive pattern forming body.

Figure 10:
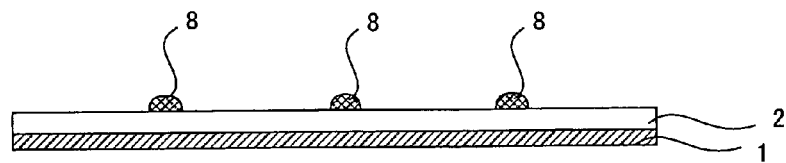
FIG. 10 is a schematic sectional view showing one example of a conductive pattern forming body according to the present invention.

As aforementioned, the conductive pattern forming body of this embodiment comprises, as shown in FIG. 10 for example, a base material 1, a photocatalyst containing layer 2 formed on this base material 1, and a conductive pattern 8 formed in a pattern on this photocatalyst containing layer 2.

As the photocatalyst containing layer, base material, metal colloid, method for forming a conductive pattern, and the like used in this embodiment, those explained in the first embodiment in the aforementioned paragraph "A. Method for manufacturing a conductive pattern forming body" may be used, therefore, explanations are omitted here.

2. Second Embodiment

Next, the second embodiment of the conductive pattern forming body of the present invention will be explained. The second embodiment of the conductive pattern forming body of the present invention comprises: a base material; a photocatalyst containing layer which is a layer formed on the base material in a pattern whose wettability of an energy irradiated part is changed so as a contact angle to a liquid is reduced, and contains at least a photocatalyst and a binder; and a metal composition formed on the photocatalyst containing layer by solidifying a metal colloid.

The conductive pattern forming body of this embodiment is provided with the photocatalyst containing layer, and it is therefore, possible to form a conductive pattern with ease by utilizing a difference in wettability, and also a conductive pattern forming body can be formed at a low cost. Also, in this embodiment, since the photocatalyst containing layer is formed in a pattern, the base material is bared in a part where no conductive pattern is formed. By this, it is possible to form a conductive pattern forming body even if the photocatalyst containing layer is relatively conductive. Also, in this case, the electric resistance of the base material is preferably in a range of $1\times10^8$ $\Omega$·cm to $1\times10^{18}$ $\Omega$·cm, and particularly preferably in a range of $1\times10^{12}$ $\Omega$·cm to $1\times10^{18}$ $\Omega$·cm. This is because it is possible to form an excellent conductive pattern forming body.

Figure 11:
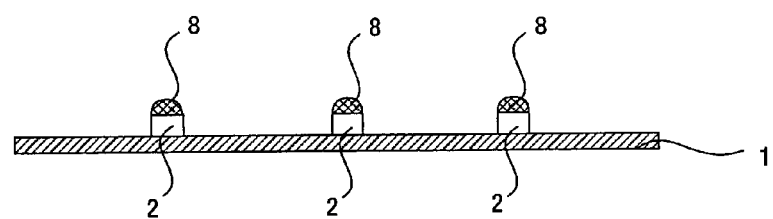
FIG. 11 is a schematic sectional view showing another example of a conductive pattern forming body according to the present invention.

This embodiment as aforementioned comprises, as shown in FIG. 11 for example, a base material 1, a photocatalyst containing layer 2 formed in a pattern on this base material 1, and a conductive pattern 8 formed on this photocatalyst containing layer 2.

As the photocatalyst containing layer, base material, metal colloid, method for forming a conductive pattern, and the like used in this embodiment, those explained in the first embodiment in the aforementioned paragraph "A. Method for manufacturing a conductive pattern forming body" may be used, therefore, explanations are omitted here.

3. Third Embodiment

Next, the third embodiment of the conductive pattern forming body of the present invention will be explained. The third embodiment of the conductive pattern forming body of the present invention comprises: a base material; a photocatalyst treatment layer contains at least a photocatalyst, on the base material; a wettability variable layer whose wettability of an energy irradiated part is changed so as a contact angle to a liquid is reduced, on the photocataylst treatment layer; and a metal composition formed on the wettability variable layer by solidifying a metal colloid in a pattern.

The conductive pattern forming body of this embodiment is provided with the wettability variable layer, and it is therefore, possible to adhere the metal colloid in a pattern easily with high precision by utilizing a difference in lyophilic properties. Also, since the photocatalyst treatment layer and the conductive pattern are not directly in contact, the possibility of the conductive pattern being affected with time by the photocatalyst is reduced, which makes it possible to produce a high quality conductive pattern forming body.

Also, since the conductive pattern is formed on the wettability variable layer in this embodiment, the electric resistance of the wettability variable layer is preferably in a range of $1\times10^8$ $\Omega$·cm to $1\times10^{18}$ $\Omega$·cm, and particularly preferably in a range of $1\times10^{12}$ $\Omega$·cm to $1\times10^{18}$ $\Omega$·cm. By this, it is possible to form an excellent conductive pattern forming body.

Figure 12:
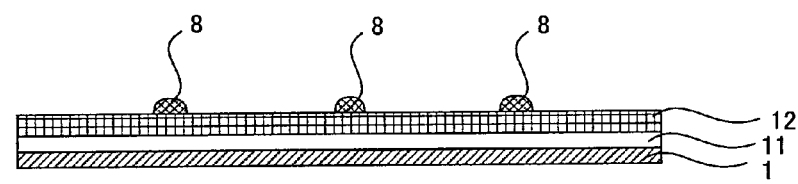
FIG. 12 is a schematic sectional view showing another example of a conductive pattern forming body according to the present invention.

As the aforementioned conductive pattern forming body of this embodiment comprises, as shown in FIG. 12 for example, a base material 1, a photocatalyst treatment layer 11 formed on the base material 1, a wettability variable layer 12 formed on the photocatalyst treatment layer 11, and a conductive pattern 8 formed in a pattern on the wettability variable layer 12.

As the photocatalyst treatment layer, wettability variable layer, base material, metal colloid, method for forming a conductive pattern, and the like used in this embodiment, those explained in the second embodiment in the aforementioned paragraph "A. Method for manufacturing a conductive pattern forming body" may be used, therefore, explanations are omitted here.

4. Fourth Embodiment

Next, the fourth embodiment of the conductive pattern forming body of the present invention will be explained. The conductive pattern forming body of this embodiment comprises: a base material; a photocatalyst treatment layer contains at least a photocatalyst, on the base material; a wettability variable layer whose wettability of an energy irradiated part is changed so as a contact angle to a liquid is reduced, formed in a pattern on the photocataylst treatment layer; and a metal composition formed on the wettability variable layer by solidifying a metal colloid.

According to the present embodiment, the wettability variable layer is provided. Therefore, it is possible to adhere the metal colloid in a pattern easily with high precision by utilizing a difference in lyophilic properties. Also, since the photocatalyst treatment layer and the conductive pattern are not directly in contact, the possibility of the conductive pattern being affected with time by the photocatalyst is reduced, which makes it possible to form a high quality conductive pattern forming body.

Also, since the wettability variable layer is formed in a pattern in this embodiment, the photocatalyst treatment layer is bared in an area where the conductive pattern is not formed. This makes it possible to form a conductive pattern forming body even in a case where the wettability variable layer is relatively conductive. In this case, the electric resistance of the photocatalyst treatment layer is preferably in a range of $1 \times 10^8$ Ω·cm to $1 \times 10^{18}$ Ω·cm, and particularly preferably in a range of $1 \times 10^{12}$ Ω·cm to $1 \times 10^{18}$ Ω·cm. By this, it is possible to form an excellent conductive pattern forming body.

Figure 13:
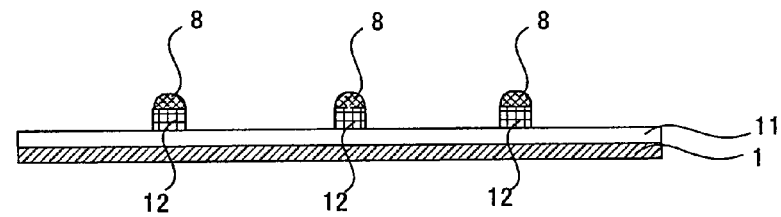
FIG. 13 is a schematic sectional view showing another example of a conductive pattern forming body according to the present invention.

As the aforementioned conductive pattern forming body of this embodiment comprises, as shown in FIG. 13 for example, a base material 1, a photocatalyst treatment layer 11 formed on the base material 1, a wettability variable layer 12 formed in a pattern on the photocatalyst treatment layer 11, and a conductive pattern 8 formed on this wettability variable layer 12 formed in a pattern.

As the photocatalyst treatment layer, wettability variable layer, base material, metal colloid, method for forming a conductive pattern, and the like used in this embodiment, those explained in the second embodiment in the aforementioned paragraph "A. Method for manufacturing a conductive pattern forming body" may be used, therefore, explanations are omitted here.

5. Fifth Embodiment

Next, the fifth embodiment of the conductive pattern forming body of the present invention will be explained. The conductive pattern forming body of this embodiment comprises: a base material; a photocatalyst treatment layer contains at least a photocatalyst, formed in a pattern on the base material; a wettability variable layer whose wettability of an energy irradiated part is changed so as a contact angle to a liquid is reduced, formed on the photocataylst treatment layer; and a metal composition formed on the wettability variable layer by solidifying a metal colloid.

According to this embodiment, the wettability variable layer is provided. Therefore, it is possible to adhere the metal colloid in a pattern easily with high precision by utilizing a difference in lyophilic properties. Also, since the photocatalyst treatment layer and the conductive pattern are not in directly contact, the possibility of the conductive pattern being affected with time by the photocatalyst is reduced, which makes it possible to form a high quality conductive pattern forming body. Also, in the conductive pattern forming body of this embodiment, the photocatalyst treatment layer is formed in a pattern on the base material, and the wettability variable layer is formed on this photocatalyst treatment layer. Further, since the conductive pattern is formed on the wettability variable layer, the base material is bared in a part where no conductive pattern is formed. This makes it possible to form a conductive pattern forming body even in a case where the photocatalyst treatment layer and the wettability variable layer are formed of conductive materials. In this case, the electric resistance of the base material is preferably in a range of $1 \times 10^8$ Ω·cm to $1 \times 10^{18}$ Ω·cm, and particularly preferably in a range of $1 \times 10^{12}$ Ω·cm to $1 \times 10^{18}$ Ω·cm. By this, it is possible to form an excellent conductive pattern forming body.

Figure 14:
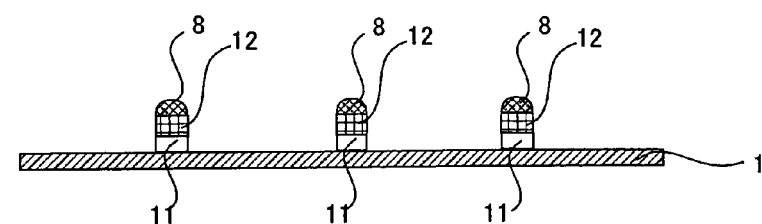
FIG. 14 is a schematic sectional view showing another example of a conductive pattern forming body according to the present invention.

As the aforementioned conductive pattern forming body of this embodiment comprises, as shown in FIG. 14 for example, a base material 1, a photocatalyst treatment layer 11 formed in a pattern on this base material 1, a wettability variable layer 12 formed on this photocatalyst treatment layer 11, and a conductive pattern 8 formed on the wettability variable layer 12.

As the photocatalyst treatment layer, wettability variable layer, base material, metal colloid, method for forming a conductive pattern, and the like used in this embodiment, those explained in the second embodiment in the aforementioned paragraph "A. Method for manufacturing a conductive pattern forming body" may be used, therefore, explanations are omitted here.

6. Sixth Embodiment

Next, the sixth embodiment of the conductive pattern forming body of the present invention will be explained. The sixth embodiment of the conductive pattern forming body of the present invention comprises: a base material; a photocatalyst treatment layer contains at least a photocatalyst, on the base material; a decomposition removal layer which is a layer decomposed and removed by an action of the photocatalyst when energy is irradiated, on the photocataylst treatment layer; and a metal composition formed on the photocatalyst treatment layer which is the decomposition removal layer is decomposed and removed, by solidifying a metal colloid in a pattern.

The conductive pattern forming body of this embodiment is provided with the decomposition removal layer, and it is therefore possible to adhere the metal colloid in a pattern with ease by utilizing irregularities of the surface by an ink jet method or the like. In the decomposition removal layer in this embodiment, a contact angle to the metal colloid of the decomposition removal layer preferably differs from a contact angle to the metal colloid of the base material which is bared as a result of the removal of the decomposition removal layer in the contact angle with the metal colloid. This is because, by this, the metal colloid can be adhered in a pattern by utilizing not only the above irregularities, but also a difference in wettability. Therefore, the pattern forming body can be formed with ease.

Moreover, in a case of this embodiment, the electric resistance of the photocatalyst treatment layer is preferably in a range of $1 \times 10^8$ Ω·cm to $1 \times 10^{18}$ Ω·cm, and particularly preferably in a range of $1 \times 10^{12}$ Ω·cm to $1 \times 10^{18}$ Ω·cm, since the conductive pattern is formed on the photocatalyst treatment layer.

Also, the electric resistance of the decomposition removal layer is preferably in a range of $1 \times 10^8$ Ω·cm to $1 \times 10^{18}$ Ω·cm, and particularly preferably in a range of $1 \times 10^{12}$ Ω·cm to $1 \times 10^{18}$ Ω·cm, since the decomposition removal layer is existing around the conductive pattern. It is thereby possible to form an excellent conductive pattern forming body.

Figure 15:
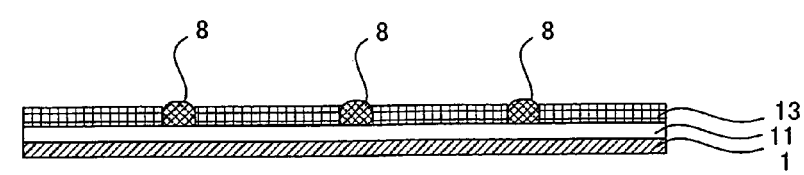
FIG. 15 is a schematic sectional view showing another example of a conductive pattern forming body according to the present invention.

In the decomposition removal layer according to this embodiment, as shown in FIG. 15 for example, a photocatalyst treatment layer 11 is formed on the base material 1, a decomposition removal layer 13 is formed on this photocatalyst treatment layer 11, and a conductive pattern 8 is formed on the photocatalyst treatment layer 11 corresponding to the part where this decomposition removal layer 13 is decomposed and removed.

As the photocatalyst treatment layer, decomposition removal layer, base material, metal colloid, method for forming a conductive pattern, and the like used in this embodiment, those explained in the third embodiment in the aforementioned paragraph "A. Method for manufacturing a conductive pattern forming body" may be used, therefore, explanations are omitted here.

7. Seventh Embodiment

Next, the seventh embodiment of the pattern forming body of the present invention will be explained. The seventh embodiment of the pattern forming body of the present invention comprises: a wettability variable layer whose wettability is changed by an action of a photocatalyst; and a metal composition formed on the wettability variable layer by solidifying a metal colloid in a pattern. The pattern forming body in this embodiment is provided with the wettability variable layer, therefore, a lyophilic area and a liquid repellent area can be formed in a pattern with ease by energy irradiation. And it is therefore possible to form a conductive pattern forming body easily by adhering the metal colloid to this lyophilic area.

Moreover, in this embodiment, the electric resistance of the wettability variable layer is preferably in a range of $1 \times 10^8$ $\Omega \cdot cm$ to $1 \times 10^{18}$ $\Omega \cdot cm$, and particularly preferably in a range of $1 \times 10^{12}$ $\Omega \cdot cm$ to $1 \times 10^{18}$ $\Omega \cdot cm$, since the conductive pattern is formed on the wettability variable layer. It is thereby possible to form an excellent conductive pattern forming body.

Figure 16A:
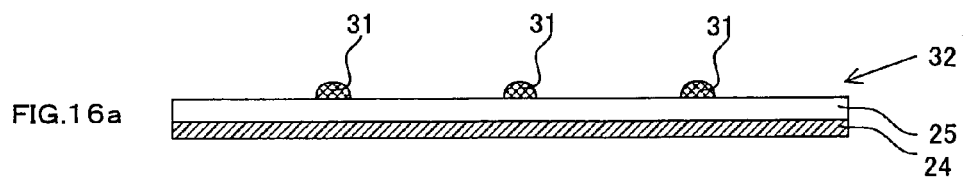
FIGS. 16a and 16b are schematic sectional views showing another example of a conductive pattern forming body according to the present invention.
Figure 16B:
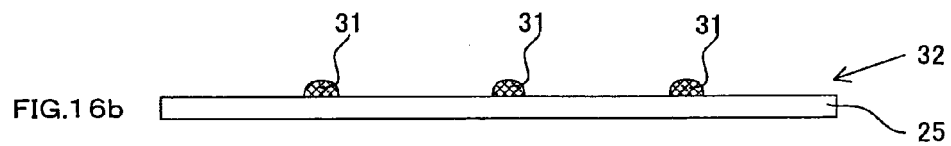

The structure and the like of the pattern forming body in this embodiment is not particularly limited as long as the pattern forming body is provided with the wettability variable layer and the metal composition formed in a pattern on the wettability variable layer. As shown in FIG. 16a for example, a wettability variable layer 25, which is one of property variable layers, may be formed on a base material 24, and a metal composition 31 may be formed in a pattern on the wettability variable layer 25. Or as shown in FIG. 16b for example, a metal composition 31 may be formed in a pattern on the wettability variable layer 25, when the wettability variable layer 25 has a self-supporting ability.

As the wettability variable layer and base material used in this embodiment, those explained in the aforementioned paragraph "Pattern forming body substrate preparing process" in the fourth embodiment of "A. Method for manufacturing a conductive pattern forming body" may be used, therefore, explanations are omitted here. Also, as the metal composition used in this embodiment is obtained by solidifying a metal colloid in a pattern. The material and the method for manufacturing are the same as those explained in the aforementioned paragraph "Metal colloid coating process" and "Conductive pattern forming process" in the fourth embodiment of "A. Method for manufacturing a conductive pattern forming body", therefore, explanations are omitted here.

8. Eighth Embodiment

Next, the eighth embodiment of the conductive pattern forming body will be explained. The eight embodiment of the conductive pattern forming body of the present invention comprises: a base material; a decomposition removal layer on the base material which is decomposed and removed by an action of a photocatalyst; and a metal composition formed on the base material which is bared by the decomposition and removal of the decomposition removal layer, by solidifying a metal colloid in a pattern.

Figure 17:
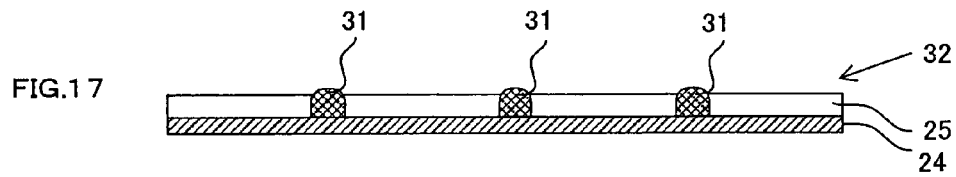
FIG. 17 is a schematic sectional view showing another example of a conductive pattern forming body according to the present invention.

The structure and the like of the conductive pattern forming body of this embodiment is not particularly limited, and comprises, as shown in FIG. 17 for example, a base material 24, a decomposition removal layer 25, which is a property variable layer, formed on the base material 24, and a metal composition 31 formed on the base material 24 which is bared as a result of decomposition and removal of this decomposition removal layer 25.

The conductive pattern forming body of this embodiment is provided with the decomposition removal layer. It is therefore possible to form irregularities in a pattern on the surface with ease by irradiating with energy and to manufacture a conductive pattern forming body by utilizing these irregularities. In the decomposition removal layer of the present invention, a contact angle of the decomposition removal layer to a metal colloid is preferably different from a contact angle of the base material to the metal collid. This reason is that a conductive pattern forming body can be manufactured by utilizing not only the irregularities on the surface, but also a difference in wettability.

Also, in this case, the electric resistance of the base material is preferably in a range of $1 \times 10^8$ $\Omega \cdot cm$ to $1 \times 10^{18}$ $\Omega \cdot cm$, and particularly preferably in a range of $1 \times 10^{12}$ $\Omega \cdot cm$ to $1 \times 10^{18}$ $\Omega \cdot cm$, since the conductive pattern is formed on the base material.

Further, the electric resistance of this decomposition removal layer is preferably in a range of $1 \times 10^8$ $\Omega \cdot cm$ to $1 \times 10^{18}$ $\Omega \cdot cm$, and particularly preferably in a range of $1 \times 10^{12}$ $\Omega \cdot cm$ to $1 \times 10^{18}$ $\Omega \cdot cm$, since the decomposition removal layer is existing around the conductive pattern. It is thereby possible to form an excellent conductive pattern forming body.

As the decomposition removal layer and base material used in this embodiment, those explained in the aforementioned paragraph "Pattern forming body substrate preparing process" in the fourth embodiment of "A. Method for manufacturing a conductive pattern forming body" may be used, therefore, explanations are omitted here. Also, the metal composition used in this embodiment is obtained by solidifying the metal colloid in a pattern. The material and the method for manufacturing are the same as those explained in the aforementioned paragraph "Metal colloid coating process" and "Conductive pattern forming process" in the fourth embodiment of "A. Method for manufacturing a conductive pattern forming body", therefore, explanations are omitted here.

9. Ninth Embodiment

Next, a ninth embodiment of the conductive pattern forming body of the present invention will be explained. The ninth embodiment of the conductive pattern forming body of the present invention comprises: a base material; a wettability variable layer formed in a pattern on the base material whose wettability is changed by an action of a photocatalyst; and a metal composition formed on the wettability variable layer, by solidifying a metal colloid.

Figure 18:
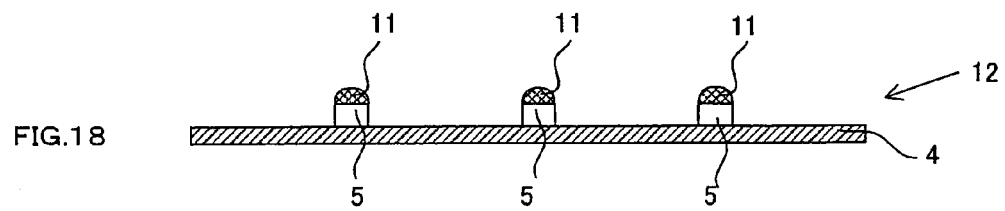
FIG. 18 is a schematic sectional view showing another example of a conductive pattern forming body according to the present invention.

The structure and the like of the conductive pattern forming body of this embodiment is not particularly limited, and comprises, as shown in FIG. 18 for example, a base material 24, a wettability variable layer 25, which is a property variable layer, formed in a pattern on the base material 24, and a metal composition 31 formed on the wettability variable layer 25.

The conductive pattern forming body of this embodiment is provided with the wettability variable layer. And it is therefore possible to manufacture the conductive pattern forming body with ease by utilizing the difference in wettability. Also, since the wettability variable layer is formed in a pattern on the base material and the conductive pattern is formed on the wettability variable layer, the base material is bared on the surface of a part other than the conductive pattern. This makes it possible to form a conductive pattern forming body even when the wettability variable layer is conductive. In this case, the electric resistance of the base material is preferably in a range of $1 \times 10^8$ Ω·cm to $1 \times 10^{18}$ Ω·cm, and particularly preferably in a range of $1 \times 10^{12}$ Ω·cm to $1 \times 10^{18}$ Ω·cm. It is thereby possible to form an excellent conductive pattern forming body.

As the decomposition removal layer and base material used in this embodiment, those explained in the aforementioned paragraph "Pattern forming body substrate preparing process" in the fourth embodiment of "A. Method for manufacturing a conductive pattern forming body" may be used, therefore, explanations are omitted here. Also, the metal composition used in this embodiment is obtained by solidifying the metal colloid in a pattern. The material and the method for manufacturing are the same as those explained in the aforementioned paragraph "Metal colloid coating process" and "Conductive pattern forming process" in the fourth embodiment of "A. Method for manufacturing a conductive pattern forming body", therefore, explanations are omitted here.

The present invention is not limited to the aforementioned embodiments. These embodiments are examples and whatever has substantially the same structure and produces the same action effect as the technical spirit described in the claim of the present invention is embraced by the technical scope of the present invention.

EXAMPLES

The present invention will be explained in more detail by way of examples and comparative examples.

Example 1

0.4 g of MF-160E (trade name, manufactured by Tochem Products Co., Ltd.) which mainly contains a fluroalkylsilane, 3 g of trimethoxymethylsilane (trade name: TSL8113, manufactured by Toshiba Silicones), and 20 g of STS-01 (tradename, manufactured by Ishihara Sangyo Kaisha, Ltd.) which was a water dispersion of titanium dioxide as a photocatalyst were mixed into 30 g of isopropyl alcohol. The mixture was stirred at 100° C. for 20 minutes to make a photocatalyst containing layer forming composition.

The above composition was coated on a blue plate glass by a spin coater and was dried at 120° C. for 10 minutes to form a photocatalyst containing layer of 0.2 µm in thickness.

The resulting layer was exposed to light (365 nm, 500 mJ/cm$^2$) by using a photomask with a 100 µm line & space to form a lyophilic area on the surface of the photocatalyst containing layer.

The contact angle of the unexposed part, that is, the liquid repellent area to a silver colloid containing water as a medium (concentration: 20 wt %) was 72°, and the contact angle of the exposed part, that is, the lyophilic area was 9°.

The above substrate was dipped in a silver colloid using water as a medium (concentration: 20 wt %), and then pulled up at a rate of 10 mm/sec, whereby the silver colloid was adhered in a pattern only on the lyophilic area. This silver colloid pattern was heated at 300° C. for 20 minutes to obtain a conductive pattern forming body in which silver is patterned on the substrate.

Example 2

0.4 g of MF-160E (trade name, manufactured by Tochem Products Co., Ltd.) which mainly contains a fluroalkylsilane, 3 g of trimethoxymethylsilane (trade name: TSL8113, manufactured by Toshiba Silicones), and 20 g of STS-01 (tradename, manufactured by Ishihara Sangyo Kaisha, Ltd.) which was a water dispersion of titanium dioxide as a photocatalyst were mixed into 30 g of isopropyl alcohol. The mixture was stirred at 100° C. for 20 minutes to make a photocatalyst containing layer forming composition.

The above composition was coated on a blue plate glass by a spin coater and was dried at 120° C. for 10 minutes to form a photocatalyst containing layer of 0.2 µm in thickness.

The resulting layer was exposed to light (365 nm, 300 mJ/cm$^2$) by using a photomask with a 100 µm line & space to form a lyophilic area on the surface of the photocatalyst containing layer.

The contact angle of the unexposed part, that is, the liquid repellent area to a silver colloid containing water as a medium (concentration: 20 wt %) was 72°, and the contact angle of the exposed part, that is, the lyophilic area was 30°.

The above substrate was dipped in a silver colloid using water as a medium (concentration: 20 wt %), and then pulled up at a rate of 10 mm/sec, whereby the silver colloid was adhered in a pattern only on the lyophilic area. This silver colloid pattern was heated at 300° C. for 20 minutes to obtain a conductive pattern forming body in which silver is patterned on the substrate.

Example 3

A photocatalyst containing layer was formed and exposed in a pattern to light in the same manner as in Example 1 to form a lyophilic area on the surface of the photocatalyst containing layer.

The contact angle of the unexposed part, that is, the liquid repellent area to a silver colloid containing water as a medium (concentration: 50 wt %) was 78°, and the contact angle of the exposed part, that is, the lyophilic area was 11°.

The above substrate was dipped in a silver colloid using water as a medium (concentration: 50 wt %), and then pulled up at a rate of 10 mm/sec, whereby the silver colloid was adhered in a pattern only on the lyophilic area. This silver colloid pattern was heated at 300° C. for 20 minutes to obtain a conductive pattern forming body in which silver is patterned on the substrate.

Comparative Example 1

0.4 g of MF-160E (trade name, manufactured by Tochem Products Co., Ltd.) which mainly contains a fluroalkylsilane, 3 g of trimethoxymethylsilane (trade name: TSL8113, manufactured by Toshiba Silicones), and 20 g of STS-01 (tradename, manufactured by Ishihara Sangyo Kaisha, Ltd.) which was a water dispersion of titanium dioxide as a photocatalyst were mixed into 30 g of isopropyl alcohol. The mixture was stirred at 100° C. for 20 minutes to make a photocatalyst containing layer forming composition.

The above composition was coated on a blue plate glass by a spin coater and was dried at 120° C. for 10 minutes to form a photocatalyst containing layer of 0.2 µm in thickness.

The resulting layer was exposed to light (365 nm, 100 mJ/cm$^2$) by using a photomask with a 100 µm line & space to form a lyophilic area on the surface of the photocatalyst containing layer.

The contact angle of the unexposed part, that is, the liquid repellent area to a silver colloid containing water as a medium (concentration: 20 wt %) was 72°, and the contact angle of the exposed part, that is, the lyophilic area was 47°.

The above substrate was dipped in a silver colloid using water as a medium (concentration: 20 wt %), and then pulled up at a rate of 10 mm/sec. However, the silver colloid was repelled on the entire surface including the lyophilic area, and thus a conductive pattern forming body could not be obtained.

Comparative Example 2

3 g of trimethoxymethylsilane (trade name: TSL8113, manufactured by Toshiba Silicones), and 20 g of STS-01 (trade name, manufactured by Ishihara Sangyo Kaisha, Ltd.) which was a water dispersion of titanium dioxide as a photocatalyst were mixed into 30 g of isopropyl alcohol. The mixture was stirred at 100° C. for 20 minutes to make a photocatalyst containing layer forming composition containing no fluorine.

The above composition was coated on a blue plate glass by a spin coater and was dried at 120° C. for 10 minutes to form a photocatalyst containing layer of 0.2 μm in thickness.

The resulting layer was exposed to light (365 nm, 500 mJ/cm$^2$) by using a photomask with a 100 μm line & space to form a lyophilic area on the surface of the photocatalyst containing layer.

The contact angle of the unexposed part, that is, the liquid repellent area to a silver colloid containing water as a medium (concentration: 20 wt %) was 45°, and the contact angle of the exposed part, that is, the lyophilic area was 10°.

The above substrate was dipped in a silver colloid using water as a medium (concentration: 20 wt %), and then pulled up at a rate of 10 mm/sec. However, the silver colloid was coated on the entire surface including the liquid repellent area, and thus a conductive pattern forming body could not be obtained.

Example 4

A photocatalyst containing layer was formed in the same manner as in Example 1, and then exposed in a pattern to light. Then, a conductive pattern was formed with a silver colloid using water as a medium to obtain a conductive pattern forming body. Next, the substrate on which the conductive pattern was formed was dipped in an aqueous alkali solution, having a pH of 13 and containing potassium hydroxide as its major component, for 2 minutes and then rinsed with water for five minutes to remove a non-drawn part.

Example 5

30 g of isopropyl alcohol, 3 g of trimethoxymethylsilane (TSL8113, manufactured by GE Toshiba Silicones Co., Ltd.), and 20 g of ST-K03 (manufactured by Ishihara Sangyo Kaisha, Ltd.) which is a photocatalyst inorganic coating agent, were mixed and was stirred at 100° C. for 20 minutes. The mixed solution was diluted with isopropyl alcohol by three times to make a photocatalyst treatment layer composition.

The photocatalyst treatment layer composition was coated on a glass substrate by a spin coater, and then dried at 150° C. for 10 minutes to form a transparent photocatalyst treatment layer (thickness: 0.15 μm).

Next, 2 g of Iupilon Z400 (manufactured by Mitsubishi Gas Chemical Company, Inc.) containing a polycarbonate as its major component was dissolved into 30 g of dichloromethane and 70 g of 1,1,2-trichloroethane to prepare a decomposition removal layer composition. The decomposition removal layer composition was coated on the photocatalyst treatment layer by a spin coater and dried at 100° C. for 60 minutes to form a transparent decomposition removal layer (thickness: 0.01 μm), thereby obtaining a pattern forming body substrate.

Next, the pattern forming body substrate was exposed to light (365 nm, 500 mJ/cm$^2$) by a high pressure mercury lamp using a photomask with a 100 μm line & space to decompose and remove the decomposition removal layer, thereby forming a lyophilic area in a pattern.

At this time, each contact angle of the unexposed part and the lyophilic area to a silver colloid using water as a medium (concentration: 20%) was measured (30 seconds after liquid droplets were dripped from a micro-syringe) by using a contact angle measuring device (CA-Z model, manufactured by Kyowa Interface Science Co., LTD.). As a result, the contact each angle was 65° and 6°.

Next, a silver colloid using water as its medium (concentration: 20%) was adhered to the lyophilic area by using an ink jet device, and then treated at 300° C. for 60 minutes to cure.

Example 6

30 g of isopropyl alcohol, 3 g of trimethoxymethylsilane (TSL8113, manufactured by GE Toshiba Silicones Co., Ltd.), and 20 g of ST-K03 (manufactured by Ishihara Sangyo Kaisha, Ltd.) which is a photocatalyst inorganic coating agent, were mixed and was stirred at 100° C. for 20 minutes. The mixed solution was diluted with isopropyl alcohol by three times to make a photocatalyst treatment layer composition.

The photocatalyst treatment layer composition was coated on a glass substrate by a spin coater, and then dried at 150° C. for 10 minutes to form a transparent photocatalyst treatment layer (thickness: 0.15 μm).

Next, 30 g of isopropyl alcohol, 3 g of fluoroalkylsilane (manufactured by GE Toshiba Silicones Co., Ltd.) and tetramethoxysilane (manufactured by GE Toshiba Silicones Co., Ltd.), and 2.5 g of 0.5N hydrochloric acid were mixed and was stirred for 8 hours. The mixed solution was diluted with isopropyl alcohol by 100 times to make a wettability variable layer composition.

The wettability variable layer composition was coated on the photocatalyst treatment layer by a spin coater, and then dried at 150° C. for 10 minutes to form a transparent wettability variable layer (thickness: 0.1 μm), thereby obtaining a pattern forming body substrate.

Next, the pattern forming body substrate was exposed to light (365 nm, 500 mJ/cm$^2$) by a high pressure mercury lamp using a photomask with a 100 μm line & space, thereby forming a lyophilic area in a pattern.

At this time, each contact angle of the unexposed part and the lyophilic area to a silver colloid using water as a medium (concentration: 20%) was measured (30 seconds after liquid droplets were dripped from a micro-syringe) by using a contact angle measuring device (CA-Z model, manufactured by Kyowa Interface Science Co., LTD.). As a result, the contact each angle was 80° and 8°.

Next, a silver colloid using water as its medium (concentration: 20%) was adhered to the lyophilic area by using an ink jet device, and then treated at 300° C. for 60 minutes to cure.

Next, the substrate on which the conductive pattern was formed was dipped in an aqueous alkali solution, having a pH of 13 and containing potassium hydroxide as its major component, for 5 minutes and then rinsed with water for 5 minutes to remove a non-drawn part of the wettability variable layer and the photocatalyst treatment layer.

Example 7

A titanium oxide coating agent TKC 301 for photocatalyst manufactured by TAYCA CORPORATION was coated on a quartz glass substrate, on which a 0.4 μm thickness chromium black matrix with 50 μm line and space was formed, and dried at 350° C. for 3 hours to prepare a photocatalyst treatment layer side substrate.

Next, 3 g of aqueous 0.1N hydrochloric acid was added to 0.4 g of MF-160E (trade name, manufactured by Tochem Products Co., Ltd.) containing fluoroalkylsilane as its major component, and was stirred at ambient temperature for 1 hour to prepare a solution. The solution was coated on a glass substrate and dried at 150° C. for 10 minutes to prepare a pattern forming body substrate.

The photocatalyst treatment layer side substrate was brought into close contact with the pattern forming body substrate, and was exposed to light (365 nm, 1000 mJ/cm$^2$) of a ultra high pressure mercury lamp from the photocatalyst treatment layer side substrate to form a lyophilic area on the surface of the pattern forming body substrate.

The contact angle of the liquid repellent area to a silver colloid using water as a medium (concentration: 20 wt %) was 75°, and the contact angle of the lyophilic area was 10°.

The above pattern forming body substrate was dipped in a silver colloid using water as a medium (concentration: 20 wt %), and then pulled up at a rate of 10 mm/sec, whereby the silver colloid was adhered in a pattern only to the lyophilic area. This silver colloid pattern was heated at 300° C. for 20 minutes to obtain a conductive pattern forming body in which silver is patterned on the substrate.

Example 8

A titanium oxide coating agent TKC 301 for photocatalyst manufactured by TAYCA CORPORATION was coated on a quartz glass substrate, on which a 0.4 μm thickness chromium black matrix with 50 μm line and space was formed, and dried at 350° C. for 3 hours to prepare a photocatalyst treatment layer side substrate.

Next, 3 g of aqueous 0.1N hydrochloric acid was added to 0.4 g of MF-160E (trade name, manufactured by Tochem Products Co., Ltd.) containing fluoroalkylsilane as its major component, and was stirred at ambient temperature for 1 hour to prepare a solution. The solution was coated on a glass substrate and dried at 150° C. for 10 minutes to prepare a pattern forming body substrate.

The photocatalyst treatment layer side substrate was brought into close contact with the pattern forming body substrate, and was exposed to light (365 nm, 600 mJ/cm$^2$) of a ultra high pressure mercury lamp from the photocatalyst treatment layer side substrate to form a lyophilic area on the surface of the pattern forming body substrate.

The contact angle of the liquid repellent area to a silver colloid using water as a medium (concentration: 20 wt %) was 75°, and the contact angle of the lyophilic area was 30°.

The above pattern forming body substrate was dipped in a silver colloid using water as a medium (concentration: 20 wt %), and then pulled up at a rate of 10 mm/sec, whereby the silver colloid was adhered in a pattern only to the lyophilic area. This silver colloid pattern was heated at 300° C. for 20 minutes to obtain a conductive pattern forming body in which silver is patterned on the substrate.

Example 9

A photocatalyst treatment layer side substrate and a pattern forming body substrate were prepared in the same manner as in Example 7 and were exposed in a pattern to light in the same manner to form a lyophilic area on the surface of the pattern forming body substrate.

The contact angle of the unexposed part, that is, the liquid repellent area to a silver colloid using water as a medium (concentration: 50 wt %) was 83°, and the contact angle of the exposed part, that is, the lyophilic area was 12°.

The above substrate was dipped in the silver colloid using water as a medium (concentration: 50 wt %), and then pulled up at a rate of 10 mm/sec, whereby the silver colloid was adhered in a pattern only on the lyophilic area. This silver colloid pattern was heated at 300° C. for 20 minutes to obtain a conductive pattern forming body in which silver is patterned on the substrate.

Comparative Example 3

A titanium oxide coating agent TKC 301 for photocatalyst manufactured by TAYCA CORPORATION was coated on a quartz glass substrate, on which a 0.4 μm thickness chromium black matrix with 50 μm line and space was formed, and dried at 350° C. for 3 hours to prepare a photocatalyst treatment layer side substrate.

Next, 3 g of aqueous 0.1N hydrochloric acid was added to 0.4 g of MF-160E (trade name, manufactured by Tochem Products Co., Ltd.) containing fluoroalkylsilane as its major component, and was stirred at ambient temperature for 1 hour to prepare a solution. The solution was coated on a glass substrate and dried at 150° C. for 10 minutes to prepare a pattern forming body substrate.

The photocatalyst treatment layer side substrate was brought into close contact with the pattern forming body substrate, and was exposed to light (365 nm, 300 mJ/cm$^2$) of a ultra high pressure mercury lamp from the photocatalyst treatment layer side substrate to form a lyophilic area on the surface of the pattern forming body substrate.

The contact angle of the liquid repellent area to a silver colloid using water as a medium (concentration: 20 wt %) was 75°, and the contact angle of the lyophilic area was 45°.

The above pattern forming body substrate was dipped in a silver colloid using water as a medium (concentration: 20 wt %), and then pulled up at a rate of 10 mm/sec. However, the silver colloid was repelled on the entire surface including the lyophilic area, and thus, a conductive pattern forming body could not be obtained.

Comparative Example 4

A titanium oxide coating agent TKC 301 for photocatalyst manufactured by TAYCA CORPORATION was coated on a quartz glass substrate, on which a 0.4 μm thickness chromium black matrix with 50 μm line and space was formed, and dried at 350° C. for 3 hours to prepare a photocatalyst treatment layer side substrate.

Next, 3 g of trimethoxymethylsilane (trade name: TSL8113, manufactured by Toshiba Silicones) and 3 g of aqueous 0.1N hydrochloric acid were added to 30 g of isopropyl alcohol and was stirred at 100° C. for 20 minutes to prepare a solution. The solution was coated on a glass substrate and dried at 150° C. for 10 minutes to prepare a pattern forming body substrate provided with a wettability variable layer containing no fluorine.

The photocatalyst treatment layer side substrate was brought into close contact with the pattern forming body substrate, and was exposed to light (365 nm, 600 mJ/cm$^2$) of a ultra high pressure mercury lamp from the photocatalyst treatment layer side substrate to form a lyophilic area on the surface of the pattern forming body substrate.

The contact angle of the liquid repellent area to a silver colloid using water as a medium (concentration: 20 wt %) was 44°, and the contact angle of the lyophilic area was 10°.

The above pattern forming body substrate was dipped in a silver colloid using water as a medium (concentration: 20 wt %), and then pulled up at a rate of 10 mm/sec. However, the silver colloid was coated on the entire surface including the liquid repellent area, and thus, a conductive pattern forming body could not be obtained.

Example 10

5 g of trimethoxymethylsilane (TSL 8113, manufactured by GE Toshiba Silicones Co., Ltd.) and 2.5 g of 0.5N hydrochloric acid were mixed and was stirred for 8 hours. This mixture was diluted with isopropyl alcohol by 10 times, thereby making a primer layer composition.

The primer layer composition was coated on a photomask substrate by a spin coater and dried at 150° C. for 10 minutes to form a transparent primer layer (thickness: 0.2 μm). Next, 30 g of isopropyl alcohol, 3 g of trimethoxymethylsilane (TSL8113, manufactured by GE Toshiba Silicones Co., Ltd.), and 20 g of ST-K03 (manufactured by Ishihara Sangyo Kaisha, Ltd.) which is a photocatalyst inorganic coating agent, were mixed and the mixture was stirred at 100° C. for 20 minutes. The mixed solution was diluted with isopropyl alcohol by 3 times to make a photocatalyst treatment layer composition. The photocatalyst treatment layer composition was coated on the photomask substrate on which the primer layer was formed by a spin coater, and then dried at 150° C. for 10 minutes to form a transparent photocatalyst treatment layer (thickness: 0.15 μm).

Next, 2 g of Iupilon Z400 (manufactured by Mitsubishi Gas Chemical Company, Inc.) containing a polycarbonate as its major component was dissolved into 30 g of dichloromethane and 70 g of 1,1,2-trichloroethane to prepare a decomposition removal layer composition. The decomposition removal layer composition was coated on a glass substrate by a spin coater and dried at 100° C. for 60 minutes to form a transparent decomposition removal layer (thickness: 0.01 μm), thereby obtaining a pattern forming body substrate.

The photocatalyst treatment layer side substrate and the decomposition removal layer were aligned so that they are facing to each other with a 100 μm gap, and then exposed to light of a ultra high pressure mercury lamp (wavelength: 365 nm) from the photomask side at an intensity of 40 mW/cm$^2$ for 600 seconds to decompose and remove the decomposition removal layer, thereby forming a decomposition removal pattern comprising the bared glass base member in a pattern.

At this time, each contact angle of the unexposed part and the decomposition removal pattern to a silver colloid using water as a medium (concentration: 20%) was measured (30 seconds after liquid droplets were dripped from a microsyringe) by using a contact angle measuring device (CA-Z model, manufactured by Kyowa Interface Science Co., LTD.). As a result, each contact angle was 65° and 6°.

Next, the silver colloid using water as its medium (concentration: 20%) was adhered to the decomposition removal pattern by using an ink jet device, and then treated at 300° C. for 60 minutes to cure, thereby forming a conductive pattern.

Finally, the substrate on which the conductive pattern was formed was dipped in an aqueous alkali solution containing potassium hydroxide as its major component and having a pH of 13 for 2 minutes, and then rinsed with water for 5 minutes to remove the non-drawn part, thereby obtaining a conductive pattern forming body.

Example 11

5 g of trimethoxymethylsilane (TSL 8113, manufactured by GE Toshiba Silicones Co., Ltd.) and 2.5 g of 0.5N hydrochloric acid were mixed and was stirred for 8 hours. This mixture was diluted with isopropyl alcohol by 10 times, thereby making a primer layer composition. The primer layer composition was coated on a photomask substrate by a spin coater and dried at 150° C. for 10 minutes to form a transparent primer layer (thickness: 0.2 μm). Next, 30 g of isopropyl alcohol, 3 g of trimethoxymethylsilane (TSL8113, manufactured by GE Toshiba Silicones Co., Ltd.), and 20 g of ST-K03 (manufactured by Ishihara Sangyo Kaisha, Ltd.) which is a photocatalyst inorganic coating agent, were mixed and the mixture was stirred at 100° C. for 20 minutes. The mixed solution was diluted with isopropyl alcohol by 3 times to make a photocatalyst treatment layer composition.

The photocatalyst treatment layer composition was coated on the photomask substrate on which the primer layer was formed by a spin coater, and then dried at 150° C. for 10 minutes to form a transparent photocatalyst treatment layer (thickness: 0.15 μm).

Next, a polydiallyldimethylammonium chloride (PDDA, average molecular weight: 100,000 to 200,000, Aldorich) which is a cationic polymer and a sodium polystyrenesulfonate (PSS, average molecular weight: 70,000, Aldorich) which is an anionic polymer were self-assembled layer by layer on a glass base member in a thickness of about 2 nm to form a pattern forming substrate.

The photocatalyst treatment layer side substrate and the decomposition removal layer were aligned so that they are facing to each other with a 50 μm gap, and then exposed to light of a ultra high pressure mercury lamp (wavelength: 365 nm) from the photomask side at an intensity of 40 mW/cm$^2$ for 120 seconds to decompose and remove the decomposition removal layer, thereby forming a decomposition removal pattern comprising the bared glass base member in a pattern.

At this time, each contact angle of the unexposed part and the decomposition removal pattern to a silver colloid using water as a medium (concentration: 20%) was measured (30 seconds after liquid droplets were dripped from a microsyringe) by using a contact angle measuring device (CA-Z model, manufactured by Kyowa Interface Science Co., LTD.). As a result, each contact angle was 62° and 6°.

Next, the silver colloid using water as its medium (concentration: 20%) was adhered to the decomposition removal pattern by using an ink jet device, and then treated at 300° C. for 60 minutes to cure, thereby obtaining a conductive pattern forming body.

What is claimed is:

1. A method for manufacturing a conductive pattern forming body comprising:
   a property variable pattern forming process of placing a photocatalyst treatment layer side substrate comprising a base member and a photocatalyst treatment layer containing a photocatalyst, and a pattern forming body substrate comprising a property variable layer whose property is changed by an action of a photocatalyst in the photocatalyst treatment layer so that the photocatalyst treatment layer and the property variable layer are placed with a gap of 200 μm or less where the photocatalyst treatment layer and the property variable layer do not contact each other, and then, irradiating with energy from a predetermined direction to form a property variable pattern, whose property is changed, on a surface of the property variable layer;

a metal colloid coating process of adhering a metal colloid in a pattern to the surface of the pattern forming body substrate on which the property variable pattern is formed by coating the metal colloid; and a process of forming a conductive pattern by solidifying the metal colloid adhered in a pattern to the property variable pattern.

2. The method for manufacturing a conductive pattern forming body according to claim 1 wherein the photocatalyst treatment layer side substrate comprises the base member and the photocatalyst treatment layer formed on the base member in a pattern.

3. The method for manufacturing a conductive pattern forming body according to claim 1 wherein the photocatalyst treatment layer side substrate prepared in the photocatalyst treatment layer side substrate preparing process comprises the base member, the photocatalyst treatment layer formed on the base member, and a photocatalyst treatment layer side light shielding part formed in a pattern; and an energy irradiation in the property variable pattern forming process is carried out from the photocatalyst treatment layer side substrate.

4. The method for manufacturing a conductive pattern forming body according to claim 3 wherein, in the photocatalyst treatment layer side substrate, the photocatalyst treatment layer side light shielding part is formed in a pattern on the base member, and the photocatalyst treatment layer is further formed thereon.

5. The method for manufacturing a conductive pattern forming body according to claim 3 wherein, in the photocatalyst treatment layer side substrate, the photocatalyst treatment layer is formed on the base member, and the photocatalyst treatment layer side light shielding part is formed in a pattern on the photocatalyst treatment layer.

6. The method for manufacturing a conductive pattern forming body according to claim 1 wherein the photocatalyst treatment layer is a layer formed by forming a photocatalyst as a film on the base member by a vacuum film forming method.

7. The method for manufacturing a conductive pattern forming body according to claim 1 wherein the photocatalyst treatment layer is a layer comprising a photocatalyst and a binder.

8. The method for manufacturing a conductive pattern forming body according to claim 1 wherein the photocatalyst is titanium dioxide ($TiO_2$).

9. The method for manufacturing a conductive pattern forming body according to claim 1 wherein, in the pattern forming body substrate preparing process, the pattern forming body substrate is prepared by forming the property variable layer on a base material.

10. The method for manufacturing a conductive pattern forming body according to claim 1 wherein the property variable layer is a wettability variable layer whose wettability is changed so as a contact angle to a liquid is reduced by an action of the photocatalyst in the photocatalyst containing layer when energy is irradiated.

11. The method for manufacturing a conductive pattern forming body according to claim 10 wherein the wettability variable layer is a layer containing an organopolysiloxane.

12. The method for manufacturing a conductive pattern forming body according to claim 11 wherein the organopolysiloxane is a polysiloxane containing a fluoroalkyl group.

13. The method for manufacturing a conductive pattern forming body according to claim 10 wherein the pattern forming body substrate comprises the wettability variable layer having a self-supporting ability.

14. The method for manufacturing a conductive pattern forming body according to claim 1 wherein the property variable layer is a decomposition removal layer which is decomposed and removed by an action of the photocatalyst in the photocatalyst treatment layer when energy is irradiated.

15. The method for manufacturing a conductive pattern forming body according to claim 14 wherein a contact angle of a liquid to the decomposition removal layer is different from a contact angle of a liquid to the base material bared by the decomposition and removal of the decomposition removal layer.

16. The method for manufacturing a conductive pattern forming body according to claim 14 wherein the decomposition removal layer is any one of a self-assembled monolayer, a Langmuir Blodgett film, and a layer-by-layer self-assembled film.

17. The method for manufacturing a conductive pattern forming body according to claim 1 wherein a clearance between the photocatalyst treatment layer and the surface of the property variable layer is in a range of 0.2 μm to 10 μm, when energy is irradiated to the surface of the property variable layer.

18. The method for manufacturing a conductive pattern forming body according to claim 1 wherein the property variable layer is a layer containing no photocatalyst.

19. The method for manufacturing a conductive pattern forming body according to claim 1 wherein the metal colloid is a silver colloid or a gold colloid using water as a medium.

20. The method for manufacturing a conductive pattern forming body according to claim 1 wherein the coating of the metal colloid in the metal colloid coating process is a dip coating method or a spin coating method.

21. The method for manufacturing a conductive pattern forming body according to claim 1 wherein the coating of the metal colloid in the metal colloid coating process is a nozzle discharging method.

22. The method for manufacturing a conductive pattern forming body according to claim 21 wherein the nozzle discharging method is an ink jet method.

* * * * *